(12) United States Patent
Sakata

(10) Patent No.: US 6,646,934 B2
(45) Date of Patent: Nov. 11, 2003

(54) SEMICONDUCTOR DEVICE

(75) Inventor: Takeshi Sakata, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/323,811

(22) Filed: Dec. 20, 2002

(65) Prior Publication Data

US 2003/0107928 A1 Jun. 12, 2003

Related U.S. Application Data

(63) Continuation of application No. 10/150,954, filed on May 21, 2002, now Pat. No. 6,538,934, which is a continuation of application No. 09/907,602, filed on Jul. 19, 2001, now Pat. No. 6,436,725, which is a continuation of application No. 09/809,256, filed on Mar. 16, 2001, now Pat. No. 6,421,284.

(30) Foreign Application Priority Data

May 26, 2000 (JP) .................................. 2000-161124

(51) Int. Cl.$^7$ ................................................ G11C 7/00
(52) U.S. Cl. ................................. 365/200; 365/189.07
(58) Field of Search .......................... 365/200, 185.09, 365/189.07, 230.06

(56) References Cited

U.S. PATENT DOCUMENTS

| | | | |
|---|---|---|---|
| 5,265,055 A | 11/1993 | Horiguchi et al. | 365/200 |
| 5,586,075 A | 12/1996 | Miwa | 365/200 |
| 5,703,824 A | 12/1997 | Isa | 365/225.7 |
| 5,900,645 A | 5/1999 | Yamada | 257/48 |
| 5,940,335 A * | 8/1999 | Kirihata | 365/200 |
| 5,970,003 A | 10/1999 | Miyatake et al. | 365/225.7 |
| 5,973,969 A | 10/1999 | Matsuki | 365/200 |
| 6,134,177 A | 10/2000 | Kang | 365/230.06 |
| 6,256,238 B1 | 7/2001 | Nagasawa et al. | 365/200 |
| 6,269,030 B1 * | 7/2001 | Hara | 365/189.07 |
| 6,327,180 B2 | 12/2001 | Taura et al. | 365/185.09 |
| 6,345,003 B1 | 2/2002 | Choi | 365/200 |

FOREIGN PATENT DOCUMENTS

| | | |
|---|---|---|
| JP | 2-192100 | 7/1990 |
| JP | 9-231781 | 9/1997 |
| JP | 10-326496 | 12/1998 |
| JP | 11-110996 | 4/1999 |
| JP | 2000-48592 | 2/2000 |

* cited by examiner

*Primary Examiner*—Tan Nguyen
(74) *Attorney, Agent, or Firm*—Mattingly, Stanger & Ma Malur, P.C.

(57) ABSTRACT

In the conventional column-side block redundancy for DRAM, competition for the replacing regions occurs unless a repair address of a large number of bits is stored in order to replace with a small replacement unit. According to one aspect of the invention, replacement decision is performed in order that a second replacement region can be made smaller than a first replacement and that the second replacement is given priority over the first replacement. Therefore, the first replacement can be controlled by a repair address of a small number of bits, thus making it possible to achieve a semiconductor device having a defect repair circuit with small area and high repair efficiency.

8 Claims, 31 Drawing Sheets

SEMICONDUCTOR DEVICE

This is a continuation application of U.S. Ser. No. 10/150,954, filed May 21, 2002, now U.S. Pat. No. 6,538,934, which is a continuation application of U.S. Ser. No. 09/907,602, filed Jul. 19, 2001, now U.S. Pat. No. 6,436,725, which is a continuation application of U.S. Ser. No. 09/809,256, file Mar. 16, 2001, now U.S. Pat. No. 6,421,284.

BACKGROUND OF THE INVENTION

The present invention generally relates to semiconductor devices (here, the invention chiefly relates to semiconductor memory devices, and a semiconductor memory device will hereinafter be described), and particularly to the redundancy technique for relieving defects by replacing defective memory cells by spare memory cells.

High-density integration of semiconductor memory has been highly advanced up to the mass production of d dynamic random access memories (DRAM) of 256 mega bits. This high-density integration advancement involves extreme reduction of element size and great increase of the number of elements, thus causing a problem of low yield due to defects. As a countermeasure against this problem, the so-called redundancy technique is known, in which the defective memory cells are replaced, or repaired by redundant memory cells as the spare, or back-up memory cells that are previously provided on a memory chip. Efforts to enhance the efficiency of the defect repair have been made in this technical field. An example of the defect repair technology for DRAM is disclosed in JP-A-2-192100 (laid open Jul. 27, 1990) in which the decision for column-side repair performed according to a row address, and column selection lines are replaced by redundant column selection lines so that block repair can be made. This method is powerful because a large number of defective memory cells can be replaced by a small number of redundant column selection lines.

FIG. 2 is a schematic diagram of a conventional logic construction for block redundancy. Here, a memory cell group of two regions including defects is replaced by a redundant memory cell group. A memory cell array NMCA and a redundant cell array RMCA are provided and controlled by a repair decision circuit YRC. The memory cell array NMCA has memory cells provided at the intersections of N word lines WLs and M data lines DLs, and the memory cells are selected by a row decoder XDEC and a column decoder YDEC. The redundant cell array RMCA has redundant memory cells provided at the intersections of N word lines WLs and P data lines RDLs, and the redundant memory cells are selected by the row decoder XDEC and a redundant column decoder RYD. The row decoder XDEC decodes a row address AX of n bits and selectively drives one of the $2^n$, or N word lines. The column decoder YDEC decodes a column address AY of m bits and selects one of the $2^m$, or M data lines DLs. The redundant column decoder RYD decodes p bits of the column address AY, and selects one of the $2^P$, or P redundant data lines RDLs. A repair decision result RYH from the repair decision circuit YRC controls the column decoder YDEC and the redundant column decoder RYD. If the repair decision result RYH is '0', the column decoder YDEC is activated to select memory cells within the memory cell array NMCA. If the repair decision result RYH is '1', the redundant column decoder RYD is activated to select redundant memory cells within the redundant cell array RMCA. Thus, the memory cell group of defects DF1, DF2 can be replaced by a redundant memory cell group. A unit of memory cells to be replaced is the area selected by Q word lines and P data lines.

The repair decision circuit YRC is formed by two row address comparators AXC, two column address comparators AYC, two dual-input AND gates AND2, and an dual-input OR gate OR2. A pair of one row address comparator AXC and one column address comparator AYC stores one region to be repaired, or replaced. Each row address comparator AXC includes address storage means for storing a repair address of (n–q) bits, and compares it with the (n–q) bits of the row address AX. Each column address comparator AYC includes address storage means for storing a repair address of (m–p) bits, and compares it with the (m–p) bits of the column address AY. The dual-input AND gates AND2 take logic products of coincidence decision results XHC1, XHC2 from the row address comparators AXC and coincidence decision results YH1, YH2 from the column address comparators AYC to produce decision results HC1, HC2 for the two, first and second replacements. The dual-input OR gate OR2 takes a logical sum of these decision results to produce the repair decision result RYH. Since the repair decision circuit is constructed as above, defects at separate column addresses can be repaired according to the row addresses, or replaced by redundant memory cells on the same redundant data line.

SUMMARY OF THE INVENTION

In the column block redundancy shown in FIG. 2, the row addresses in the first replacement must be different from those in the second replacement. In other words, the repair row address stored in one of the two row address comparators AXC must be different from that of the other. If the same row address were stored in the two comparators, the replacing regions RPD would be one region, or the replaced regions would compete with each other for acquiring the one region irrespective of whether the column addresses of the replaced regions RPO are different or not. Therefore, even though two repair addresses can be stored, it is impossible to repair the case in which two defects occur in different-column-address regions but in the same-row-address regions each of which is selected by Q word lines and P data lines. In order to reduce the probability of that case in which both defects cannot be relieved because the replaced regions RPO compete with each other about taking one replacing region RPD, it can be considered to decrease the number, Q of word lines that are one replacement unit. However, if the number Q is decreased, it is necessary to increase the number of bits, (n–q) of the row address that the row address comparator AXC compares with, so that the circuit scale of the row address comparator becomes large.

Accordingly, it is desired to contrive a method of effectively repairing a plurality of defects at the same time. That is, it is an object of the invention to provide a semiconductor memory device having a redundancy circuit capable of effectively repairing defects by use of small-circuit-scale address comparators that compare with a smaller number of bits, and by controlling the replacement operation so that the competition between the replaced regions can be avoided.

According to one aspect of the invention, there is provided a semiconductor memory device having a plurality of word lines, a plurality of bit lines arranged to intersect the plurality of word lines, a large number of memory cells arranged at necessary intersections between the plurality of word lines and the plurality of bit lines, a plurality of spare bit lines arranged to intersect the plurality of word lines, a plurality of spare memory cells arranged at necessary intersections between the plurality of word lines and the plurality of spare bit lines, and a redundancy circuit for replacing memory cell groups, including defects, of the large number of memory cells by spare memory cell groups of the spare memory cells, wherein the redundancy circuit has functions to control a first replacement to be made by a first replacing unit, and a second replacement to be made by a second replacing unit that is smaller than the first replacing unit, and to give the second replacement priority when the first and second replacements compete with each other about taking the replacing spare memory cell groups.

In other words, the redundancy circuit controls the first replacement to be made by the first replacing unit and the second replacement to be made by the second replacing unit that is smaller than the first replacing unit, and it includes a first decision circuit for deciding about at least a first part of an address provided to select the large number of memory cells, a second address decision circuit for deciding about a second part of the address, and a third address decision-circuit for deciding about at least a third part of the address except the second part, whereby when the second address decision circuit produces a miss, the second replacement is not performed but the first replacement is made according to the output from the first address decision circuit, and when the second address decision circuit produces a hit, the first replacement is not performed but the second replacement is made according to the output from the third address decision circuit.

DESCRIPTION OF THE EMBODIMENTS

<Embodiment 1>

Figure 1:
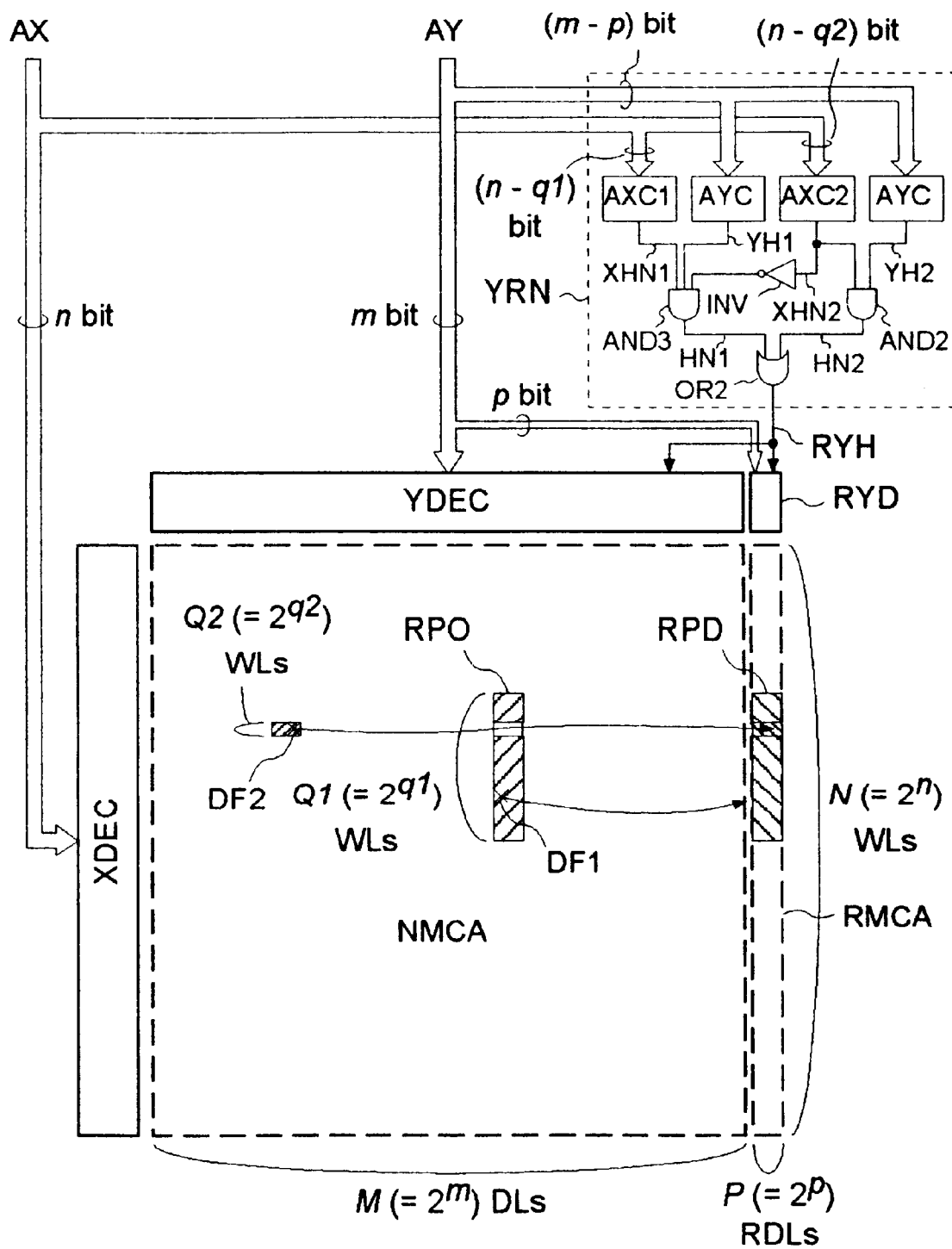
FIG. 1 is a schematic diagram of the column redundancy system according to one embodiment of the invention.

FIG. 1 is a schematic diagram of an embodiment of the redundancy system in which the present invention is applied to the column system repair. As illustrated, a memory cell group of two regions including defects is replaced by a redundant memory cell group in a manner similar to the conventional block redundancy shown in FIG. 2. In this case, however, the feature is that the replaced region in the second replacement is made smaller than in the first replacement, and that the replacement decision is so made that the second replacement can be given priority.

Figure 2:
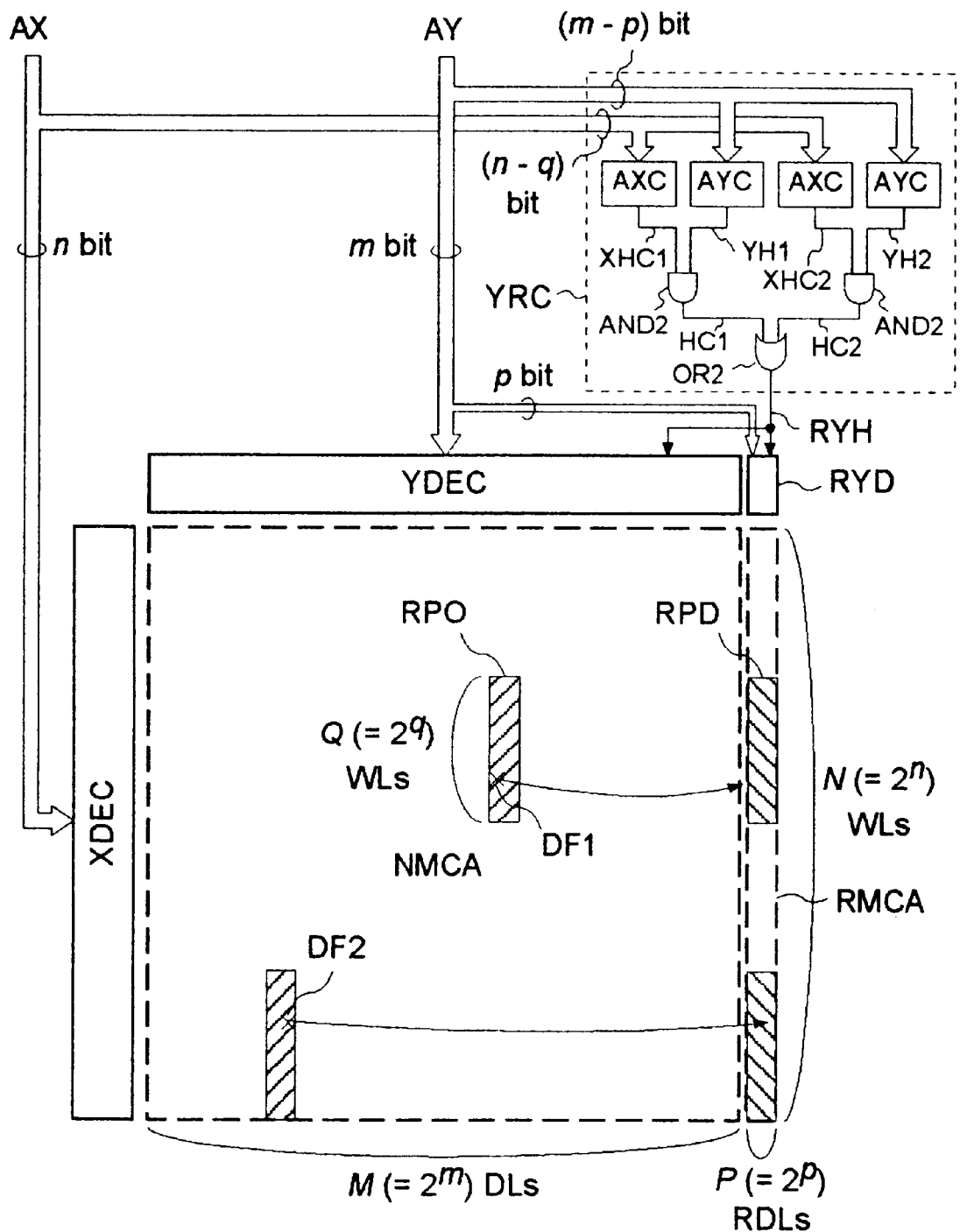
FIG. 2 is a schematic diagram of the conventional column redundancy system.

The construction of this embodiment except the repair decision circuit YRN is the same as that of the conventional example shown in FIG. 2. In other words, the redundant cell array RMCA is provided relative to the memory cell array NMCA, and those arrays are controlled by the repair decision circuit YRN. The memory cell array NMCA has memory cells provided at the intersections of N word lines WLs and M data lines DLs, and the memory cells are selected by the row decoder XDEC and column decoder YDEC. The redundant cell array RMCA has redundant memory cells provided at the intersections of N word lines WLs and P data lines RDLs, and the redundant memory cells are selected by the row decoder XDEC and redundant column decoder RYD. The row decoder XDEC decodes the row address AX of n bits, and selectively drives one of the $2^n$, or N word lines WLs. The column decoder YDEC decodes the column address AY of m bits, and selects one of the $2^m$, or M data lines DLs. The redundant column decoder RYD decodes the p bits of the column address AY, and selects one of the $2^P$, or P redundant data lines RDLs. The repair decision result RYH from the repair decision circuit YRN controls the column decoder YDEC and redundant column decoder RYD so that the memory cell group of defective portions DF1, DF2 can be replaced by a redundant memory cell group.

The repair decision circuit YRN has two row address comparators AXC1, AXC2, two column address comparators AYC, an inverter INV, a three-input AND gate AND3, a dual-input AND gate AND2, and a dual-input OR gate OR2. The row address comparator AXC1 and column address comparator AYC store a repair address for the first replacement, and the row address comparator AXC2 and column address comparator AYC store another repair address for the second replacement. The row address comparator AXC1 includes address storage means for storing (n-q1) bits of the repair address, and compares with the (n-q1) bits of the row address AX. The row address comparator AXC2 includes address storage means for storing (n-q2) bits of the repair address, sand compares with the (n-q2) bits of the row address AX. Each of the column address comparators AYC includes address storage means for storing (m-p) bits of the repair address, and compares with the (m-p) bits of the column address AY. The inverter INV inverts the coincidence decision result XHN2 from the row address comparator AXC2, and supplies the inverted result to the three-input AND gate AND3. The AND gate AND3 takes a logical product of this inverted result, the coincidence decision result XHN1 from the row address comparator AXC1, and the coincidence decision result YH1 from the column address comparator AYC. Thus, the AND gate AND3 produces the first decision result HN1 for the first replacement. The dual-input AND gate AND2 takes a logic product of the coincidence decision result XHN2 from the row address comparator AXC2 and the coincidence decision result YH2 from the column address comparator AYC. Thus, the AND gate AND2 produces the second decision result HN2 for the second replacement. The dual-input OR gate OR2 takes a logic sum of the decision results HN1 and HN2 to produce the repair decision result RYH. Since the repair decision circuit YRN is constructed as above, when the row address comparator AXC1 produces a hit, or coincidence, and when the row address comparator AXC2 a miss, or inconsistence, the first decision result HN1 depends on the decision result YH2 from the column address comparator AYC. When both the row address comparators AXC1, AXC2 produce hits, or coincidence, the first decision result HN1 is '0'. If the row address comparator AXC2 produces a hit, or coincidence, irrespective of whether the coincidence decision result XHN1 from the row address comparator AXC1 is a hit or miss, the second decision result HN2 depends on the coincidence decision result YH2 from the column address comparator AYC. In other words, the second replacement is given priority over the first replacement. Here, the hit or miss is, of course, a predetermined electric potential.

The replacement unit for the first replacement is a region to be selected by the $2^{q1}$, or Q1 word lines WLs and P data lines DLs. The replacement unit for the second replacement is a region to be selected by the $2^{q2}$, or Q2 word lines WLs and P data lines DLs. In this case, if the Q1 word lines in the first replacement includes the Q2 word lines in the second replacement, the first replacement unit is an except-inside region to be selected by the P data lines and the (Q1-Q2) word lines resulting from the subtraction of the second replacement word lines Q2 from the first replacement word lines Q1. At this time, of the region selected by the Q1 word lines and P data lines, the memory cells selected by the Q2 word lines in the second replacement are not replaced by the redundant memory cells, but accessed.

If the first defect DF1 is the memory cell at the intersection of the first word line WLi and the first data line DLi, and the second defect DF2 the memory cell at the intersection of the second word line WLj and the second data line DLj, the second word line WLj is also included in the first replacement region, and thus both regions compete with each other about the replacing region RPD. In the present invention, when the second word line WLj and the first data line DLi are selected, the memory element at that intersection is not replaced, and the first data line DLi is accessed to.

In this repair method, if the second replacement unit region selected by the Q2 word lines is different, from the first replacement region, and each of those regions has a defect, then those defects can be repaired. By decreasing the word line number Q2, it is possible to lower the probability that both defects cannot be repaired due to competition even if the word line number Q1 is large. At that time, the bit number (n-q2) of the row address with which the row address comparator AXC2 compares becomes large, thus requiring the circuit it scale of the row address comparator AXC2 to grow. However, the bit number (n-q1) of the row address with which the row address comparator AXC1 compares is small, thus the circuit scale of the row address comparator AXC1 being small. Therefore, since the small-scale address comparator that compares with a smaller number of bits than the prior art can control the replacement so that the competition for the replacing region can be avoided, the defects can be effectively relieved.

<Embodiment 2>

Figure 3:
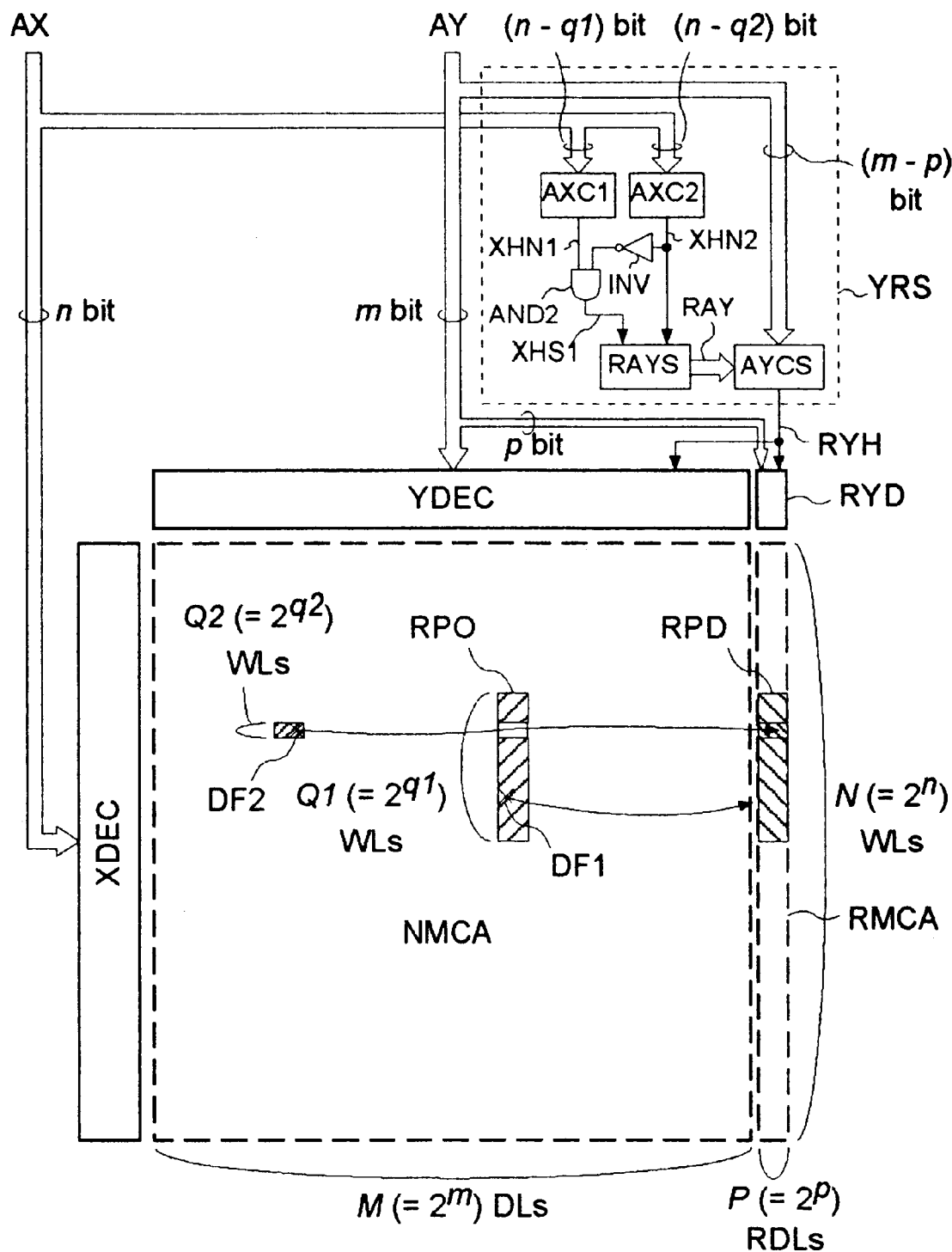
FIG. 3 is a schematic diagram of another embodiment of the column redundant system according to the invention.

FIG. 3 is a schematic diagram of another embodiment of the redundant system that can make the same column-side repair as in FIG. 1. The construction of this embodiment except the repair decision circuit YRS is the same as that shown in FIG. 1. That is, there are provided the memory cell array NMCA, redundant cell array RMCA, row decoder XDEC, column decoder YDEC and redundant column decoder RYD.

The repair decision circuit YRS includes two row address comparators AXC1, AXC2, a repair column address selector RAYS, a column address comparator AYCS, an inverter INV, and a dual-input AND gate AND2. The row address comparators AXC1, AXC2 store repair row addresses for first and second replacements, respectively. The repair column address selector RAYS stores repair column addresses for first and second replacements. Like the construction of FIG. 1, the row address comparator AXCI includes address storage means for storing one repair row address of (n-q1) bits, and compares with the (n-q1) bits of the row address AX. The row address comparator AXC2 includes address storage means for storing the other repair row address of (n-q2) bits, and compares with the (n-q2) bits of the row address AX. The inverter INV inverts the coincidence decision result XHN2 from the row address comparator AXC2, and supplies it to the dual-input AND gate AND2. The dual-input AND gate AND2 takes a logic product of this inverted result and the coincidence decision result XHN1 from the row address comparator AXC1. Thus, the dual-input AND gate produces the first row decision result XHS1 for the first replacement. The repair column address selector RAYS includes two address storage means each of which stores a repair column address of (m-p) bits. This selector RAYS selects one of the repair column addresses for the first and second replacements in accordance with the first row decision result XHS1 and the coincidence decision result XHN2 from the row address comparator AXC2, and produces a repair column address RAY of (m–p) bits. The column address comparator AYCS compares this repair column address RAY with the (m–p) bits of the column address AY, and produces the repair decision result RYH. Since the repair decision circuit is constructed as above, when both the two row address comparators AXC1, AXC2 produce hits, or coincidence, the first row decision result XHS1 is '0', and hence the repair column address selector RAYS produces the repair column address for the second replacement as the repair column address RAY. In other words, the second replacement is given priority over the first replacement.

The same effective replacement as in FIG. 1 can also be achieved by use of this repair decision circuit YRS.

In addition, since column address comparison is made after selecting a repair column address, only one column address comparator AYCS is necessary. The result is that the circuit scale of the repair decision circuit YRN can be made smaller than that shown in FIG. 1. Therefore, by using a smaller circuit-scale repair decision circuit YRS than that of FIG. 1, it is possible to control the replacement operations and effectively relieve defects so that the competition for the replacing region can be avoided.

<Embodiment 3>

A more specific embodiment for achieving the column-side redundancy system shown in FIG. 3 will be described with reference to FIGS. 4 through 17. This embodiment is an application of the invention to the column-side block redundancy of synchronous DRAM (SDRAM). The whole structure of an SDRAM will be described with reference to FIG. 4 that is a block diagram of a main portion of SDRAM. The indirect periphery circuits of SDRAM includes a clock buffer CKB, a control signal buffer CB, a command decoder CD, an address buffer AB, a column address counter YCT, an input buffer DIB, and an output buffer DOB. In addition, in association with the memory array MAR, there are provided a row-side redundancy circuit XR, a row pre-decoder XPD, a column-side repair decision circuit YR, a column pre-decoder YPD, a write buffer WB, and a main amplifier MA, which, including the memory array constitute a memory core sector SCT0, similarly SCT1, . . . The number of the memory core sectors corresponds to the number of memory arrays that depends on the specifications such as memory capacity and bank number. Here, for the sake of simplicity, only two sectors are shown.

Each circuit block plays a role as follows. The clock buffer CKB takes an external clock CLK as an internal clock CLK1, and distributes it to the command decoder CD and so on. The command decoder CD is responsive to a control signal CMD fed from the outside to generate control signals for controlling the address buffer AB, column address counter YCT, input buffer DIB and output buffer DOB. In a necessary timing with the external clock CLK, the address buffer AB takes in an address ADR fed from the outside, and distributes a row address BX to the sectors SCT0, SCT1. The address buffer AB also takes in a column address, and supplies it to the column address counter YCT. The column address counter YCT generates a column address BY for burst operation with the input column address used as the initial value, and distributes it to the sectors SCT0, SCT1. The input buffer DIB takes in input/output data DQ from the outside and supplies write data GI with a necessary timing. The output buffer DOB supplies read data GO to input/output data DQ with a necessary timing.

Within the sector SCT0, or SCT1, the row-side redundancy circuit XR decides the presence or absence of replacement relative to the row address BX, and supplies a row-side repair decision result RXH to the row pre-decoder XPD. The row pre-decoder XPD receives the row address BX and row-side repair decision result RXH, and supplies a desired mat selection signal MS and row pre-decode address CX to the memory array MAR. The column-side repair decision circuit YR decides the presence or absence of replacement relative to the row address BX and column address BY, and supplies the column-side repair decision result RYH to the column pre-decoder YPD. The column pre-decoder YPD receives the column address BY and column-side repair decision result RYH, pre-decodes the column address BY, and supplies the column pre-decoded address CY to the memory array MAR. The write buffer WB supplies the input write data GI to a main input/output line MI0. The main amplifier MA amplifies the signal on the main input/output line MI0, and generates the read data GO.

Figure 4:
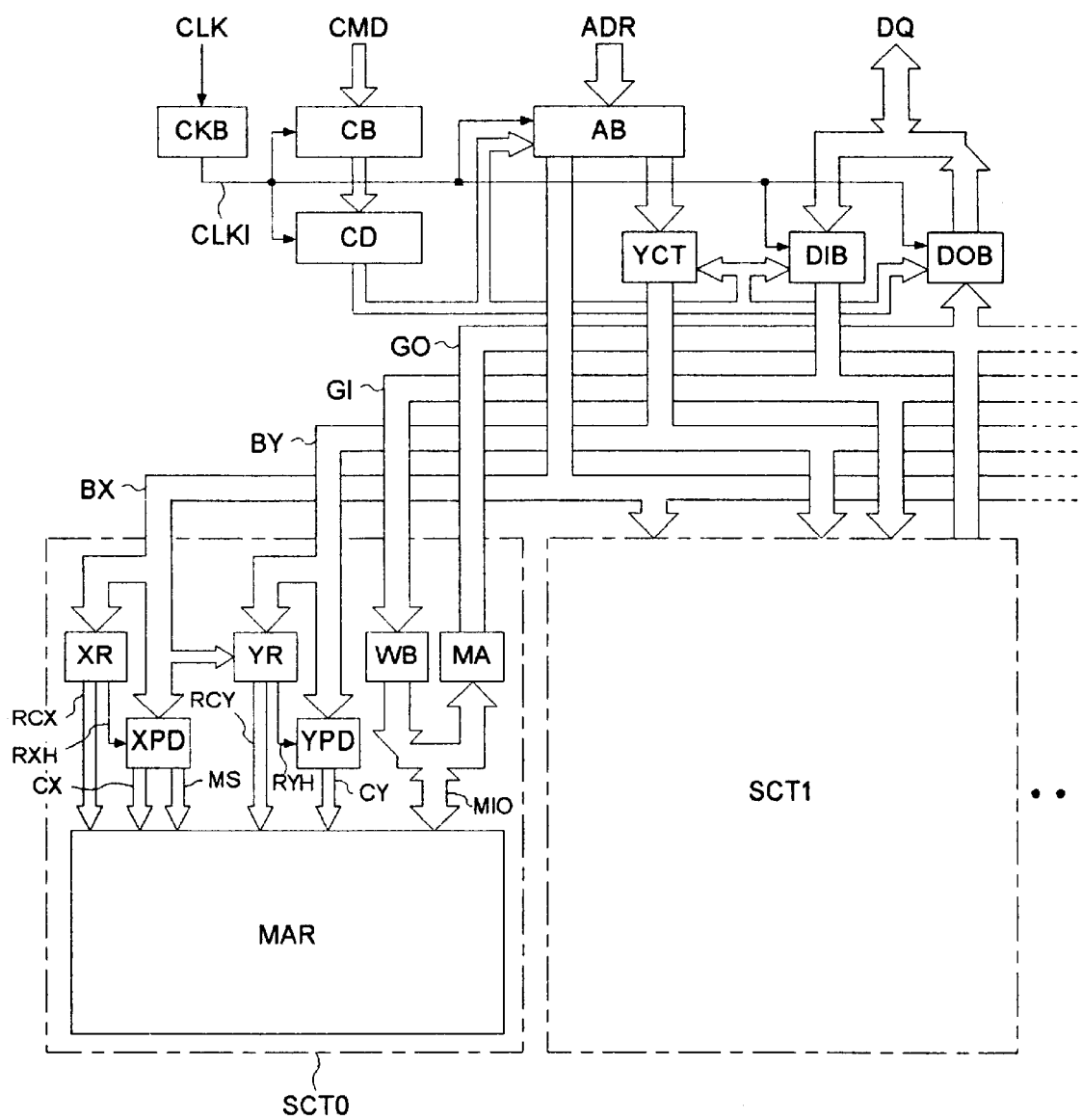
FIG. 4 is a block diagram of an embodiment of the structure of SDRAM according to the invention.
Figure 5:
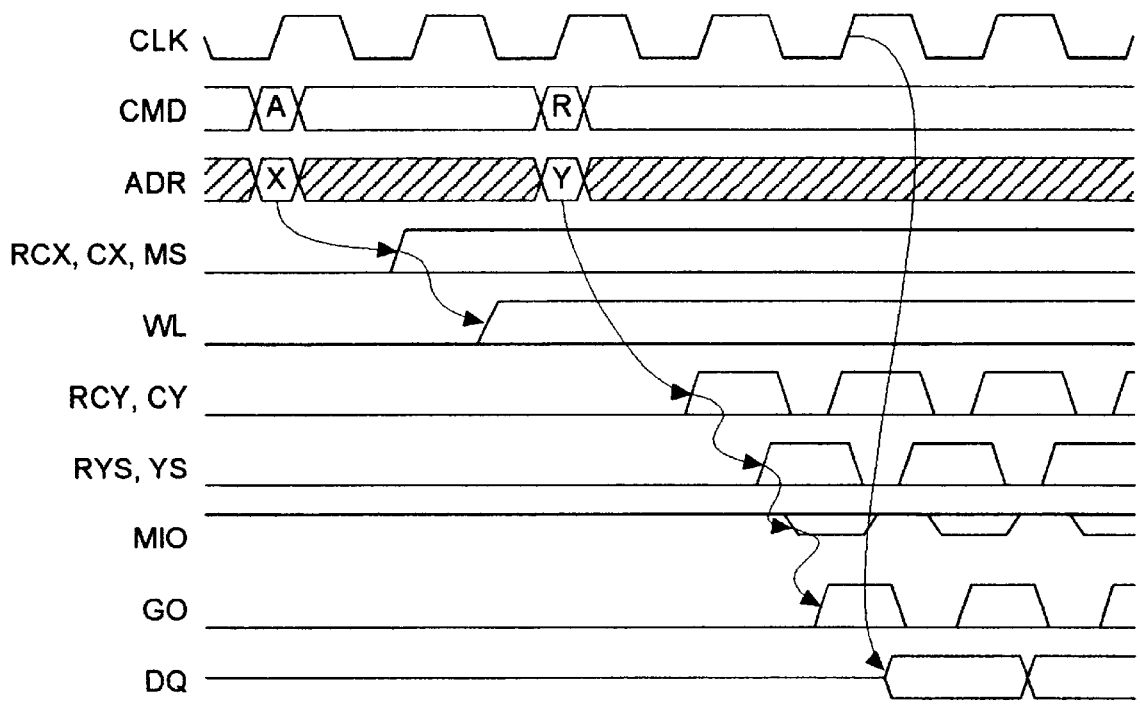
FIG. 5 is a timing chart of SDRAM shown in FIG. 4.

FIG. 5 is a timing chart of read operation in the SDRAM structure shown in FIG. 4. The operation of SDRAM of FIG. 4 will be described with reference to this timing chart of FIG. 5. Each time the external clock CLK rises up, the command decoder CD makes a judgment on the control signal CMD, and gives an activate command A thereto. Thus, the address buffer is controlled to take in the row address X from the address ADR, and generates the row address BX.

The sector SCT0 or SCT1 responds to this row address to generate the desired mat selection signal and row pre-decode address CX. Thus, the word line WL is selected within the memory array MAR as described later. In addition, since the read command R is given to the control signal CMD, the address buffer AB takes in the column address Y from the address ADR. The column address counter YCT operates at each clock cycle to generate the column address BY. The column-side repair decision circuit YR within the sector SCT0 or SCT1 operates in response to the row address BX and column address BY so that the column pre-decode address CY or redundant column address signal RCY can be generated. Therefore, the column selection line YS or redundant column selection line RYS is selected within the memory array MAR as described later. Consequently, a signal is read out on the main input/output line MI0, and thus the main amplifier MA generates the read data GO. In addition, the output buffer DOB supplies data to the input/output data DQ in timing with the external clock CLK.

Thus, in the SDRAM, a necessary number of clock cycles after the row address X is taken in, the column address Y is taken in. This operation is made in order to reduce the pin number of address. Since the column-side operation is performed after the end of the row-side operation in the memory core sector, the access time is not affected even though the column address is taken in after the row address. As will be described later, in this embodiment, the delay due to the repair decision can be prevented from affecting the access time by utilizing this time margin.

Figure 6:
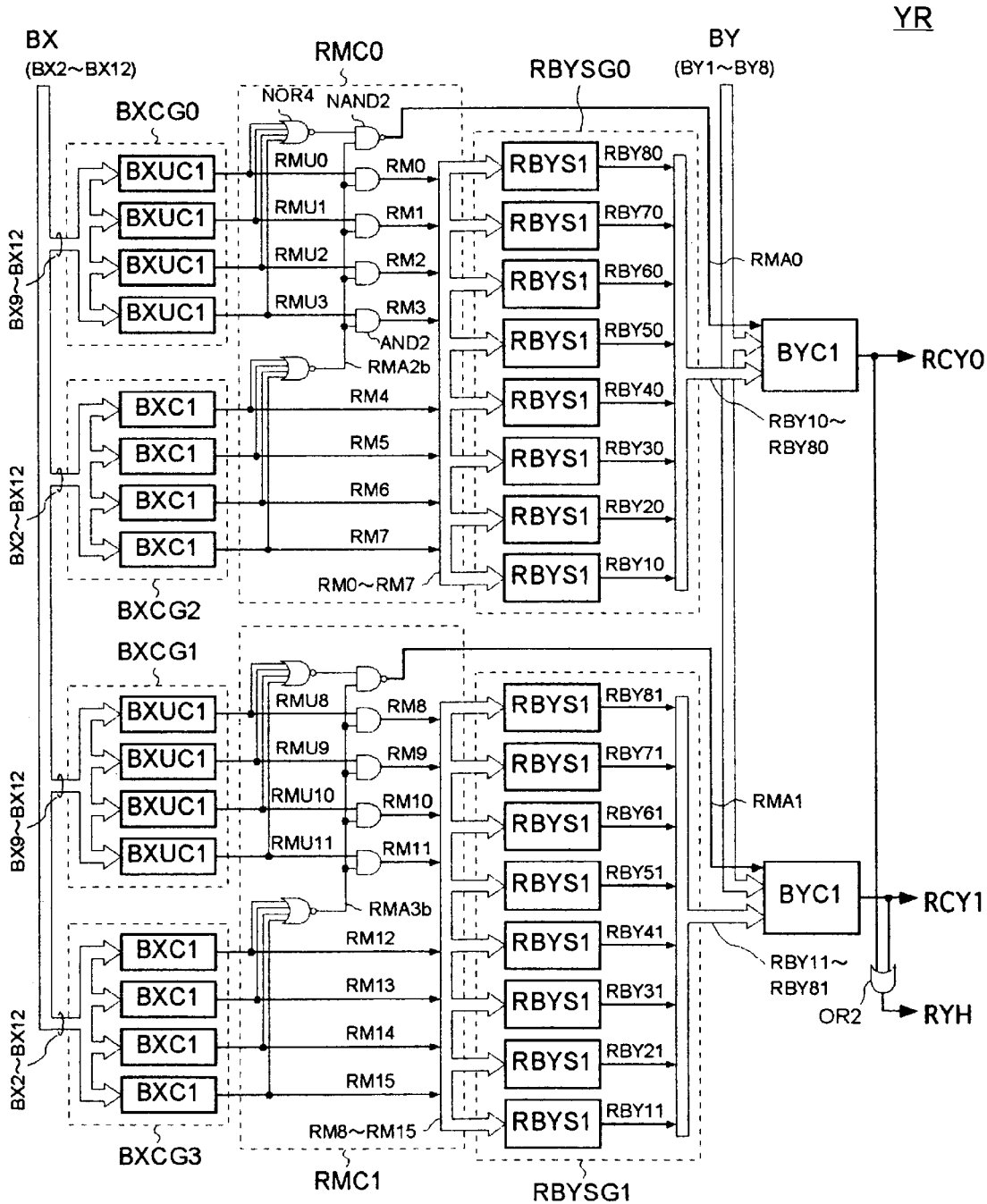
FIG. 6 is a diagram of an example of the construction of the column-side repair decision circuit shown in FIG. 3.

FIG. 6 shows an example of the structure of the column-side redundancy decision circuit YR shown in FIG. 3. This example can produce two compared decision results RCY0, RCY1 each of which can control a maximum of 8 replacements. This column-side redundancy decision circuit has four row address comparator groups BXCG0 through BXCG3, two control circuits RMC0, RMC1 for the row address compared results, two repair column address selector groups RBYSG0, RBYSG1, two column address comparators BYC1, and a dual-input OR gate OR2.

The row address comparator group BXCG0 is formed of four high-order row address comparators BXUC1. Each row address comparator BXUC1 has a repair row address of 4 bits stored, and compares with the high-order four bits BX9~BX12 of the input row address BX to produce a row address compared result RMU0~RMU3. Each row address comparator BXUC1 corresponds to the block redundancy for mat unit which will be described later. The row address comparator group BXCG2 is formed of four row address comparators BXC1. Each row address comparator BXC1 has a repair row address of 11 bits stored, and compares with the 11 bits BX2~BX12 of the input row address BX to generate a row address compared result RM4~RM7. This row address comparator BXC1, since it compares with 11 bits that is 7 bits more than the high-order row address comparator BXUC1, makes block redundancy for the smaller unit, or unit of 1/128 of the sub-array. This deals with the so-called bit repair which will be described later. The control circuit RMC0 has two four-input NOR gates NOR4, a dual-input NAND gate NAND2, and four dual-input AND gates AND2. The logic sum of row address compared results RMU0~RMU3 and the logic sum of RM4~RM7 can be produced on an output RMA0. This output signal RMA0 indicates the presence or absence of the replaced repair column address relative to the input row address BX. In addition, when the row address compared results RM4~RM7 are all '0', the node RMA2$b$ is '1'. As a result, the row address compared results RMU0~RMU3 are produced as row address decision results RM0~RM3. If any one of the row address compared results RM4~RM7 is '1', the node RMA2$b$ is '0', and hence the row address decision results RM0~RM3 are made '0'. Therefore, the row address compared results RM4~RM7 are given priority over the row address compared results RMU0~RMU3, so that the competition for the replacing region can be avoided like the embodiment mentioned above. The repair column address selector group RBYSG0 is formed of eight address selectors RBYS1. Each address selector RBYS1 selects one bit of the repair column address RBY10~RBY80 in response to the input row address decision results RM0~RM3 and row address compared results RM4~RM7. Thus, the eight bits of the repair column address are respectively stored in the eight address selectors RBYS1. In other words, a set of fuses for storing one replacement address space is formed of one fuse within the row address comparator BXUC1 or BXC1, and eight fuses within the eight address selectors RBYS1. The column address comparator BYC1, when the control signal RMA0 generated from the control circuit RMC0 is '1', compares the repair column address RBY10~RBY80 and the column address BY (BY1~BY8) to produce the compared decision result RCY0.

The row address comparator groups BXCG1, BXCG3, control circuit RMC1, repair column address selector group RBYSG1, and column address comparator BYC1 similarly operate to produce the compared decision result RCY1. The dual-input OR gate OR2 takes a logic sum of two compared decision results RCY0, RCY1 to produce the column-side repair decision result RYH. The more specific constructions and operations of these circuits will be described below.

Figure 7:
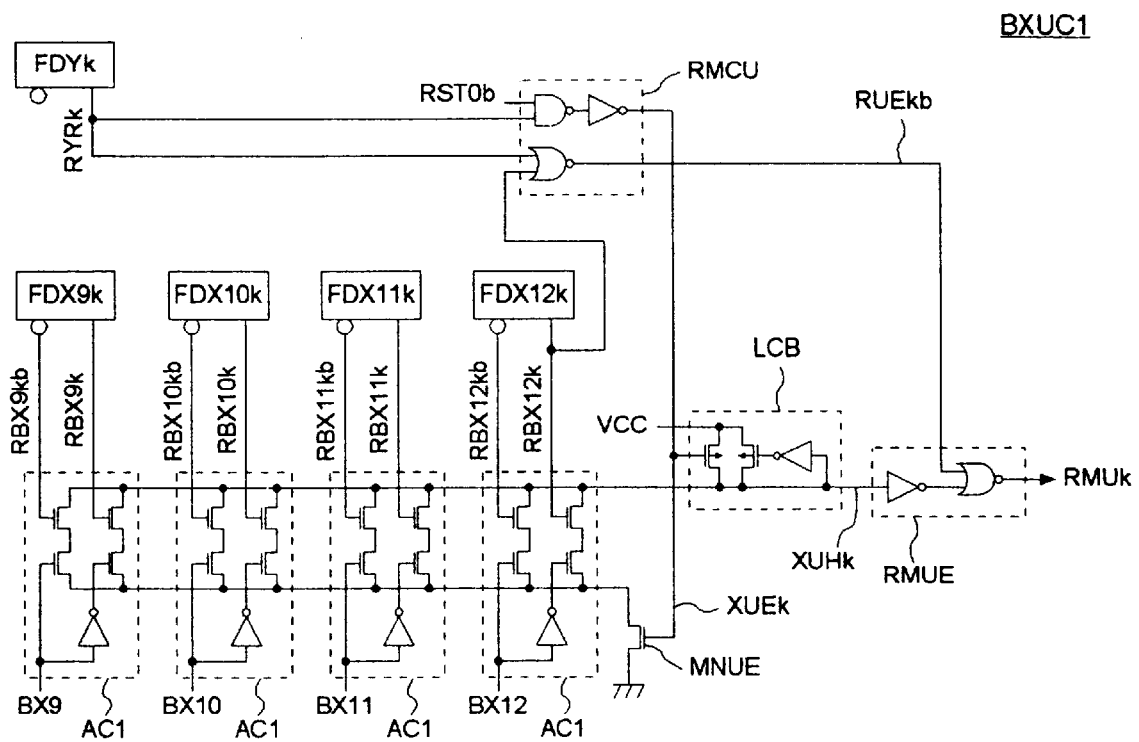
FIG. 7 is a diagram of an example of the construction of the row address comparator for the block replacement shown in FIG. 6.

FIG. 7 shows an example of the construction of the high-order row address comparator BXUC1 shown in FIG. 6. This high-order row address comparator BXUC1 includes five fuse decision circuits FDYk, FDX9$k$~FDX12$k$, a control circuit RMCU, four one-bit comparators AC1, an NMOS transistor MNUE, a latch circuit LCB, and an enable circuit RMUE. The control circuit RMCU is formed of a dual-input NAND gate, an inverter and a dual-input NOR gate. Each one-bit comparator AC1 is formed of four NMOS transistors and an inverter. The latch circuit LCB is formed of two PMOS transistors, and an inverter. The enable circuit RMUE is formed of an inverter and a dual-input NOR gate. When a fuse is not blown out, the true RBX9$k$ of, for example, the fuse decision circuit FDX9$k$ is low level, and the bar output RBX9$kb$ thereof is high level. On the contrary, when a fuse is blown, the true output RBX9$k$ is high level, and bar output RBX9$kb$ is low level. The operations of this high-order row address comparator BXUC1 are divided roughly into three categories depending on whether or not the fuse decision circiuits FDYk and FDX12$k$ have fuses blown out.

When the fuse decision circuit FDYk has its fuse blown out, to generate output RYRk of high level, the four more-significant bits BX9~BX12 of the row address are compared with the repair address recorded within the four fuse decision circuits FDX9$k$~FDX12$k$. At this time, the control circuit RMCU controls the enable signal RUEkb to be low level, and the node XUEk is controlled by a reset control signal RST0$b$. Each one-bit comparator AC1 compares the output of the fuse decision circuit, for example, RBX9$k$ with the input row address, for example, BX9. If the compared result is not coincident, the two serially-connected NMOS transistors are both turned on, thus constituting a current path. When the reset control signal RST0$b$ becomes high level, the node XUEk is high level, and the NMOS transistor MNUE is turned on. If any one of the outputs RBX9$k$~RBX12$k$ of the fuse decision circuits FDX9$k$~FDX12$k$ is not coincident with the corresponding one of the high-order row addresses BX9~BX12, the node XUHk discharges through the corresponding one-bit comparator AC1. The result is that the compared result RMUk is low level, or '0'. If all the outputs RBX9$k$~RBX12$k$ of the fuse decision circuits FDX9$k$~FDX12$k$ coincide with the high-order row addresses BX9~BX12, no current path through any one-bit comparator AC1 is formed, and thus the node XUHK is maintained high level by the latch circuit LCB. The result is that the compared-result RMUk is high level, or '1'.

When the fuse decision circuit FDYk has its fuse not blown out to generate the output RYRk of low level, and when the fuse decision circuit FDX12$k$ has its fuse blown out to generate the output RBX12$k$ of high level, the compared result RMUk becomes '1'irrespective of the row address. This operation deals with the so-called YS repair for replacing the whole column selection lines as will be described later. In this case, the control circuit RMCU controls the enable signal RUEkb to be low level, and the node XUEk is low level irrespective of the reset control signal RST0$b$. Since the NMOS transistor MNUE is not turned on, the node XUHk is kept high level by the latch circuit LCB, and thus the compared result RMUk is '1'.

When the fuse decision circuits FDYk and FDX12$k$ have their fuses not blown out to generate outputs RYRk and RBX12$k$ of low level, the compared result RMUk is '0'irrespective of the row address. This operation deals with the case of not using the fuse set for this high-order row address comparator BXUC1. In this case, the control circuit RMCU controls the enable signal RUEkb to be high level, and the node XUEk is low level irrespective of the reset control signal RST0$b$. Since the NMOS transistor MNUE is not turned on, the node XUHk is kept high level by the latch circuit LCB. However, since the enable signal RUEkb is high level, the compared result RMUk is low level, or '0'.

The circuit scale of this high-order row address comparator is reduced by use of a dynamic CMOS logic circuit. In addition, the fuse decision circuit FDX12k having the repair row address RBX12k stored for block redundancy is used for decision of whether or not YS repair is used, thereby reducing the fuse number.

Figure 8:
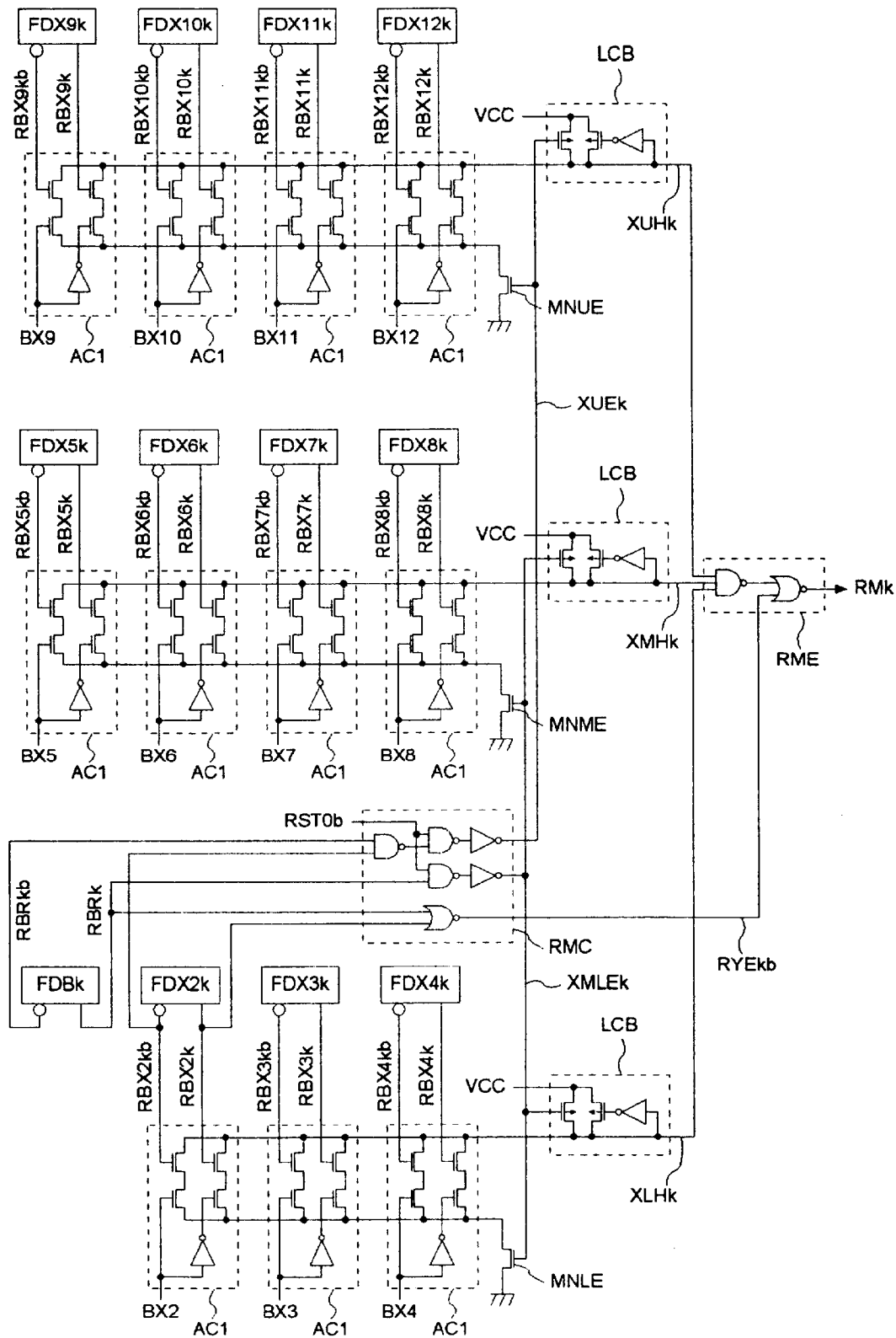
FIG. 8 is a diagram of an example of the construction of the row address comparator shown in FIG. 6.

FIG. 8 shows an example of the construction of the row address comparator BXC1 shown in FIG. 6. This row address comparator BXC1 has 12 fuse decision circuits FDBk, FDX2k~FDX12k, a control circuit RMC, 11 one-bit comparators AC1, three NMOS transistors MNLE, MNME, MNUE, three latch circuits LCB, and an enable circuit RME. The one-bit comparators AC1 and latch circuits LCB have the same constructions as shown in FIG. 7. The control circuit RMC is formed of three dual-input NAND gates, two inverters and a dual-input NOR gate. The enable circuit RME is formed of a three-input NAND gate and a dual-input NOR gate. The operations of this row address comparator BXC1 are divided roughly into three categories as below depending on whether or not the fuse decision circuits FDBk and FDX2k have their fuses blown out.

When the fuse decision circuit FDBk has its fuse blown out to generate the output RBRk of high level, the row address BX2~BX12 is compared with the repair address recorded within the eleven fuse decision circuits FDX2k~FDX12k. At this time, the control circuit RMC controls the enable signal RYEkb to be low level, and the nodes XMLEk, XUEk are controlled by the reset control signal RST0b. When the reset control signal RST0b becomes high level, the nodes XMLEk, YUEk are high level, and the NMOS transistors MNLE, MNME, MNUE are turned on. If any one of the outputs RBX2k~RBX4k of the fuse decision circuits FDX2k~FDX4k is not coincident with the corresponding one of the row address BX2~BX4, the node XLHk discharges through the corresponding one-bit comparator AC1 so as to be low level. If all the outputs RBX2k~RBX4k of the fuse decision circuits FDX2k~FDX4k coincide with the row address BX2~BX4, no current path is formed through any one-bit comparator AC1, and thus the node XLHk is kept high level by the latch circuit LCB. Similarly, when any one of the outputs RBX5k~RBX8k of the fuse decision circuits FDX5k~FDX8k is not coincident with the corresponding one of the row address BX5~BX8, the node XMHk is low level. If all outputs are coincident with the row address, the node XMHk can be maintained high level. In addition, if any one of the outputs RBX9k~RBX12k of the fuse decision circuits FDX9k~FDX12k is not coincident with the corresponding one of the row address BX5~BX8, the node XUHk becomes low level. If all the outputs coincide with the row address, the node XUHk is kept high level. Since the enable signal RYEkb is low level, if all the nodes XLHk, XMHk, XUHk are high level, the enable circuit RME takes a logic product of all high levels to produce the compared result RMk of high level. However, if any one of the nodes is low level, the compared result RMk becomes low level. In other words, the result of comparing the row address BX2~BX12 with the repair address stored in the eleven fuse decision circuits FDX2k~FDX12k is the compared result RMk.

When the fuse decision circuit FDBk has its fuse not blown out so as to generate the output RBRk of low level, and when the fuse decision circuit FDX2k has its fuse blown out so as to produce the output RBX2k of high level, the four more-significant bits BX9~BX12 of the row address are compared with the repair address recorded within the four fuse decision circuits FDX9k~FDX12k. In this case, the same function as in the high-order row address of FIG. 7 can be obtained, thus dealing with the block redundancy for each mat. In that case, the control circuit RMC controls the enable signal RUEkb to be low level, and the node XMLEk is low level, but the node XUEk is controlled by the reset control signal RST0b. Since the NMOS transistors MNLE, MNME are not turned on, the nodes XLHk, XMHk are kept high level irrespective of the row address. On the other hand, if any one of the outputs RBX9k~RBX12k of the fuse decision circuits FDX9k~FDX12k is not coincident with the corresponding one of the row address BX5~BX8, the node XUHk become low level. If all the outputs coincide with the row address, the node XUHk is kept high level. The compared result RMUk becomes '1'. Since the enable signal RYEkb is low level, the enable circuit RME produces the value of node XUHk as the compared output RMk. In other words, the result of comparing the row address BX9~BX12 with the repair address recorded within the four fuse decision circuits FDX9k~FDX12k is the compared result RMk.

When the fuse decision circuits FDBk and FDX2k have fuses not blown out to generate outputs RBRk and RBX2k of low level, the compared result RMUk is '0' irrespective of the row address. This operation deals with the case in which the fuse set for this row address comparator BXC1 is not used. In this case, the control circuit RMCU controls the enable signal RYEkb to high level, and the nodes XNLEk, XUEk are low level irrespective of the reset control signal RST0b. Since the NMOS transistors MNLE, MNME, MNUE are not turned on, the nodes XLHk, XMHk, XUHk are kept high level by the latch circuit LCB. However, since the enable signal RYEkb is high level, the compared result RMk is low level, or '0'.

The circuit scale of this row address comparator is also reduced by use of a dynamic CMOS logic circuit like the high-order row address comparator BXUC1 shown in FIG. 7. However, since the number of bits to be compared is large, the dynamic circuit arrangement is divided into three portions so as to stably operate. In addition, the fuse decision circuit FDX2k that stores the repair row address RBX2k for bit repair is used for the decision of the presence or absence of block redundancy, thereby reducing the fuse number.

Figure 9:
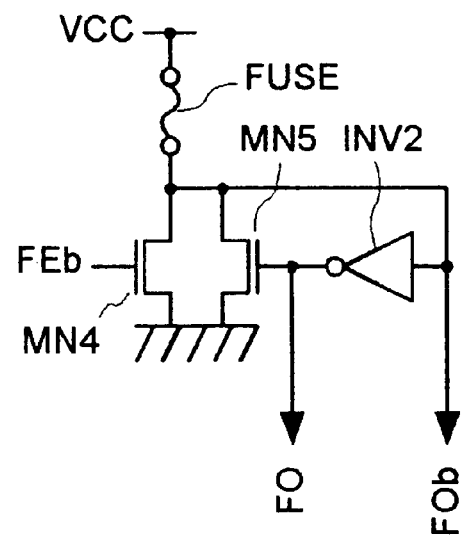
FIG. 9 is a diagram of an example of the construction of the fuse decision circuit shown in FIGS. 7 and 8.

FIG. 9 shows an example of the construction of the fuse decision circuit shown in FIGS. 7 and 8. This fuse decision circuit is formed of a fuse FUSE, NMOS transistors MN4, MN5, and a CMOS inverter INV2. The fuse FUSE can be formed by a wiring conductor layer or the like, and selectively blown out by laser.

This fuse decision circuit operates as follows. While the enable signal FEb is high level, the NMOS transistor MN4 is conductive. When the fuse FUSE is broken away, the bar output F0b and true output F0 are respectively reset to be low level and high level. When the enable signal FE becomes high level, the NMOS transistor MN4 is turned off. When the fuse FUSE is not broken away, the bar output F0b and true output F0 are respectively high level and low level. When the fuse FUSE is broken away, the NMOS transistor MN5 keeps the bar output F0b to be low level, and the inverter INV2 keeps the true output F0 to be high level.

When the fuse FUSE is not broken away, the penetrating current flows as long as the enable signal FEb is high level. If the gate width and length of the NMOS transistor are decreased and increased, respectively, the penetrating current decreases, but the layout area increases. According to the invention, since effective repair can be attained with a small number of fuses, the number of fuse decision circuits can be decreased, and thus the problem with this penetrating current can also be alleviated.

This fuse decision circuit can produce complementary outputs by use of the CMOS inverter INV0 necessary for full amplitude output. Therefore, this fuse decision circuit is suitable for the construction using complementary fuse decision results as shown in FIGS. 7 and 8. When only the true output decision result is required as indicated by FDYk in FIG. 7, only the output F0 is used.

Instead of using the fuse, it is possible to use an anti-fuse that is formed by a capacitor. In that case, since it can be electrically blown out, there is no need to provide an opening in order to blow out by laser, and thus the manufacturing process can be simplified. In some case, it can be blown out even after being assembled in a package. However, the anti-fuse decision circuit needs a large number of elements as compared with the normal fuse decision circuit. In addition, the transistor area becomes large because the transistor size must be determined so that the transistor in which current flows when it is blown out can have resistance low enough and that the transistor for determining the load resistance at the time of decision can have resistance high enough. The repair system according to the invention can achieve effective redundancy with a small number of fuses, and alleviate the problem with the anti-fuse decision circuit area, and thus it is suitable for the repair decision circuit using the anti-fuse.

Figure 10:
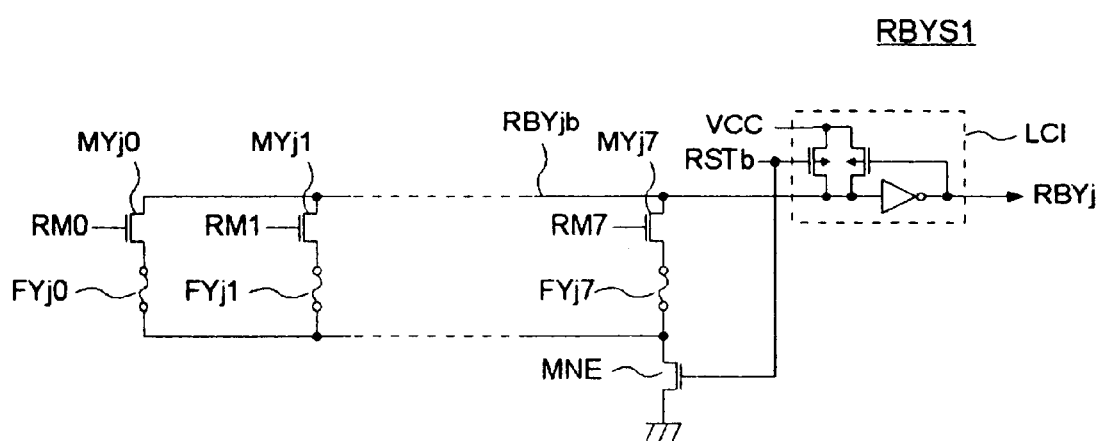
FIG. 10 is a diagram of an example of the construction of a repair column address selector.

FIG. 10 shows an example of the construction of the address selector RBYS1. The address selector RBYS1 has eight fuses FYj0~FYj7, nine NMOS transistors MNE, MYj0~MYj7, and an inverter LCI with a latch function. The inverter LCI with latch function is formed of two PMOS transistors and an inverter. The repair column address stored by the fuses is selected according to the row address decision results RM0~RM3 and row address compared results RM4~RM7. The fuses of the row address comparators BXUC1 and BXC1 are set so that any one of the row address decision results RM0~RM3 and row address compared results RM4~RM7 is high level with the others being low level or that all are low level.

In the standby mode, the reset signal RSTb, node RBYjb and output node RBYj are reset to be low level, high level and low level, respectively. If the row address decision result RM0 is high level with the others being low level, and if the reset signal RSTb becomes high level, the NMOS transistor MNE is turned on. If the fuse FYj0 is not blown out, the node RBYjb is discharged to be low level, and the output node RBYj is made high level by the inverter LCI with latch function. If the fuse FYj0 is blown out, the inverter LCI with latch function keeps the node RBYjb to be high level, and the output node RBYj to be low level.

Thus, since the dynamic compound gate including fuses is used as above, the complicated logic for repair column address selection can be achieved by a small-scale circuit arrangement. Moreover, since the NMOS transistor MNE is nonconductive until the reset signal RSTb becomes high level, there is no problem with the penetrating current unlike the fuse decision circuit shown in FIG. 9.

The fuses shown in FIG. 10 can be replaced by anti-fuses if blow controlling transistors are added to the arrangement of FIG. 10. In addition, NMOS transistors can be provided instead of the fuses shown in FIG. 10, and controlled in their gates by the outputs from the anti-fuse decision circuits. In that case, it is easy to construct the circuits for blowing out the anti-fuses.

Figure 11:
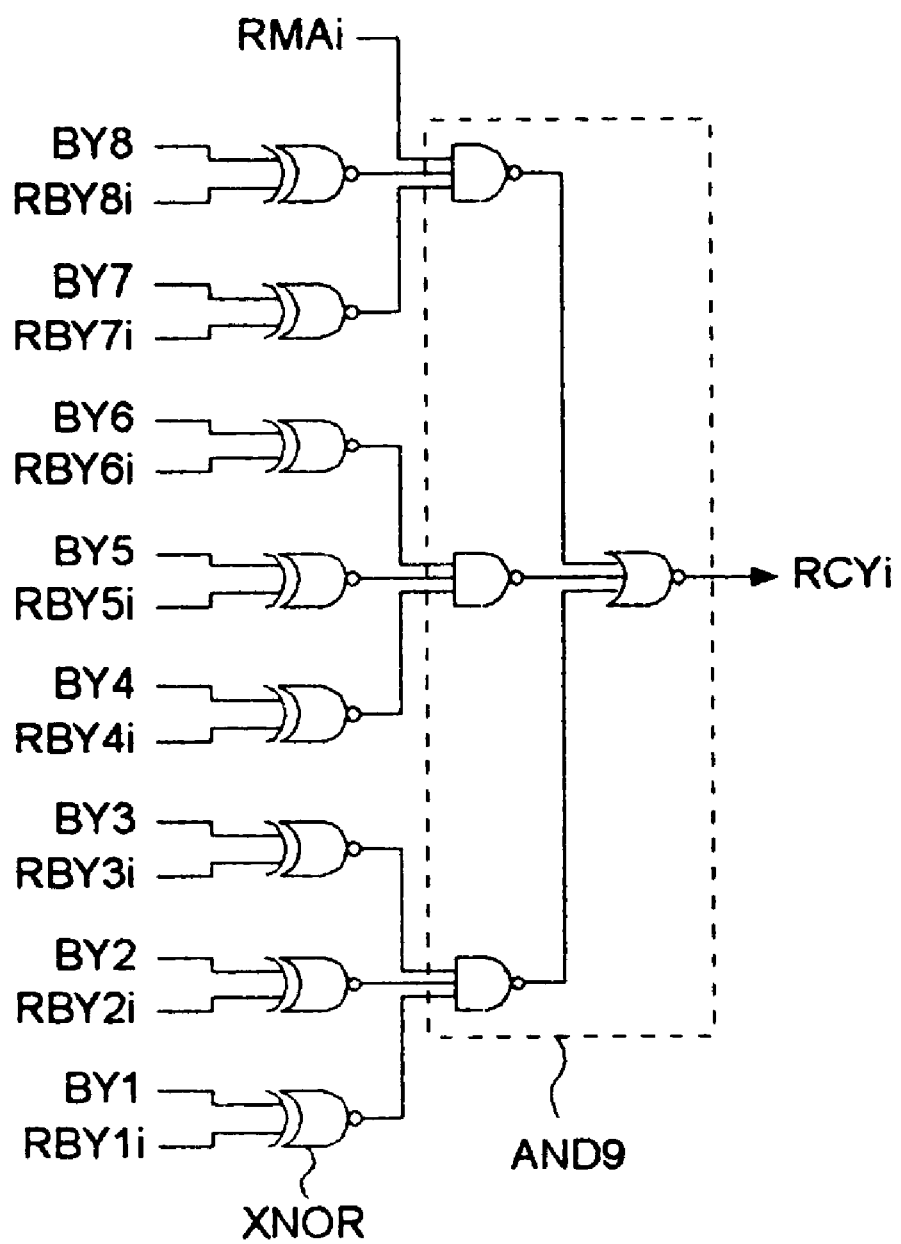
FIG. 11 is a diagram of an example of the construction of the column address comparator shown in FIG. 6.

FIG. 11 shows an example of the construction of the column address comparator BYC1 shown in FIG. 6. The column address comparator BYC1 has eight exclusive NOR gates. XNOR, and a nine-input AND gate AND9 that is formed of three tri-input NAND gates and a tri-input NOR gate. The eight exclusive NOR gates XNOR compare the repair column address RBY1$i$~RBY8$i$ with the column address BY1$i$~BY8$i$ bit by bit. The nine-input AND gate AND9 takes logic products of those results and an input signal RMAi to produce a compared decision result RCYi. Here, since the input signal RMAi that indicates the presence or absence of the repair column address is used for taking logical products, the compared decision result RCYi becomes low level when all the row address decision results RM0~RM3 and row address compared results RM4~RM7 are low level.

This column address comparator starts to operate when the column pre-decode address BY is inputted, and acts as a critical path that decides the access time from the read command R shown in FIG. 5. Thus, it is formed by static CMOS circuits so as not to need the timing margin and so as to reduce the delay time. The row address comparators BXUC1, BXC1 and address selector RBYS1 that operate before the read command R are made dynamic circuits so as to be reduced in their circuit scale. Since these circuits are not included in the critical path, they can be stably operated with the dynamic margin assured enough.

The arrangement associated with the column-side operation, of the circuit blocks shown in FIG. 4, will be described in detail in order to clarify the role of the column-side repair decision circuit YR mentioned above.

Figure 12:
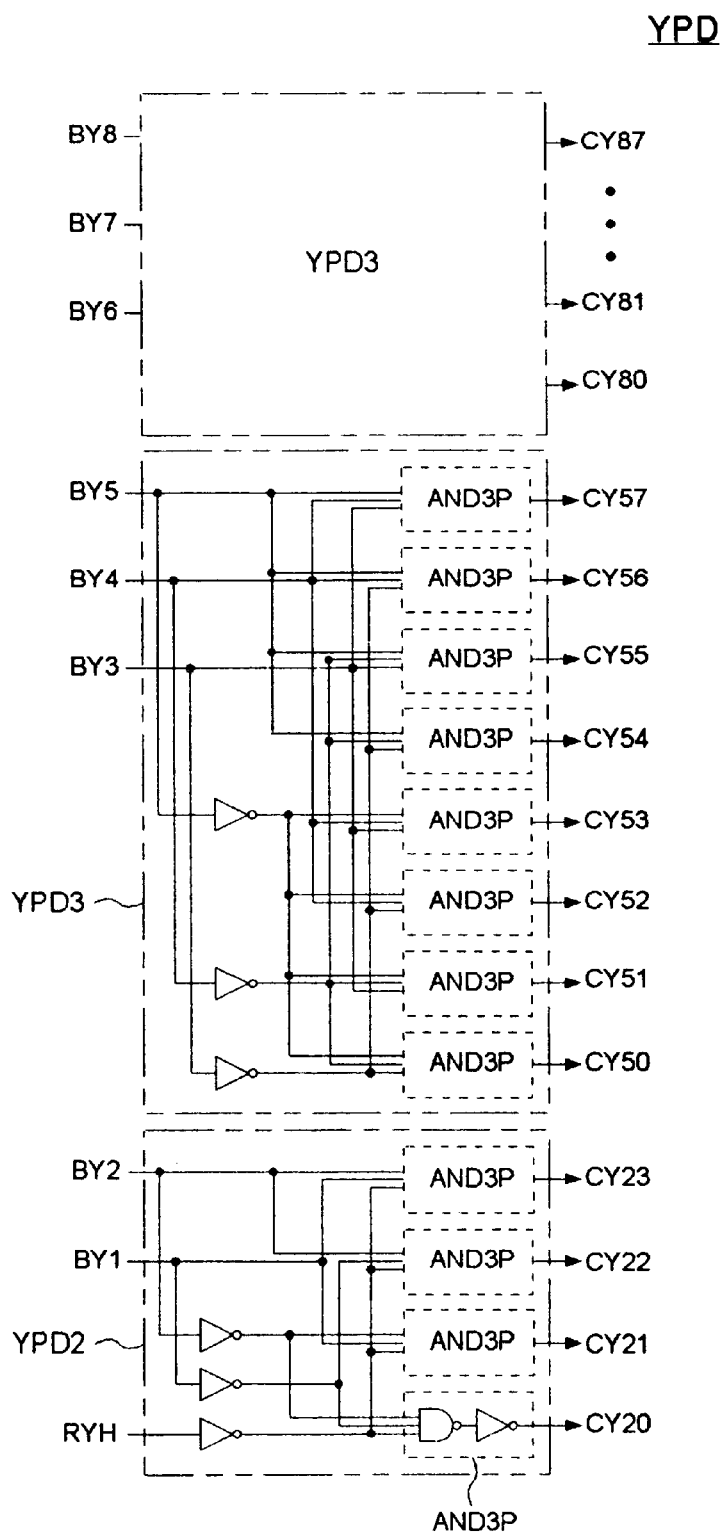
FIG. 12 is a diagram of an example of the construction of the column pre-decoder shown in FIG. 4.

FIG. 12 shows an example of the construction of the column pre-decoder YPD shown in FIG. 4. As described above, the column address BY1~BY8 is pre-decoded, and supplies column pre-decode addresses CY20~CY23, CY50~CY57, CY80~CY87 to the column decoder within the memory array MAR shown in FIG. 4. The pre-decoder YPD has a two-bit pre-decoder YPD2 that pre-decodes the column address BY1, BY2 to generate column pre-decoded address CY20~CY23, and two 3-bit pre-decoders YPD3 that pre-decode the column address BY3~BY5 and BY6~BY8 to generate the column pre-decoded address CY50~CY57 and CY80~CY87, respectively. The two-bit pre-decoder YPD2 is formed by three inverters, and four three-input AND gates AND3P each of which includes a three-input NAND gate and an inverter. The column-side defect repair decision result RYH from the column-side defect repair decision circuit YR is inverted by an inverter, and then supplied to the three-input AND gate AND3P. The three-input AND gate AND3P takes a logic product of this inverted column-side defect repair decision result, the column address BY1 or its inverted signal, and the column address BY2 or its inverted signal, and produces the column pre-decoded address CY20~CY23. In other words, if the column-side defect repair decision result RYH is high level, the column pre-decoded address CY20~CY23 is all made low level. If the RYH is low level, any one of the column pre-decoded address CY20~CY23 is made high level according to the column address BY1, BY2. The three-bit pre-decoder YPD3 is formed of three inverters, and eight three-input AND gates AND3P, and it pre-decodes the input column address of three bits.

The two-bit pre-decoder YPD2 makes all column pre-decoded address CY20~CY23 low level when the column-side defect repair decision result RYH is high level. As described later, when the normal column selection lines are replaced by redundant column selection lines, the operation for the normal column selection lines is stopped. Here, since the column pre-decoded addresses CY50~CY57, CY80~CY87 are produced irrespective of the column-side defect repair decision result RYH, the column-side repair decision result RYH is not supplied to the two three-bit pre-decoders YPD3 so that the load connected to the column-side defect repair decision circuit RYH can be reduced. Thus, the delay time in the critical path can be shortened.

Figure 13:
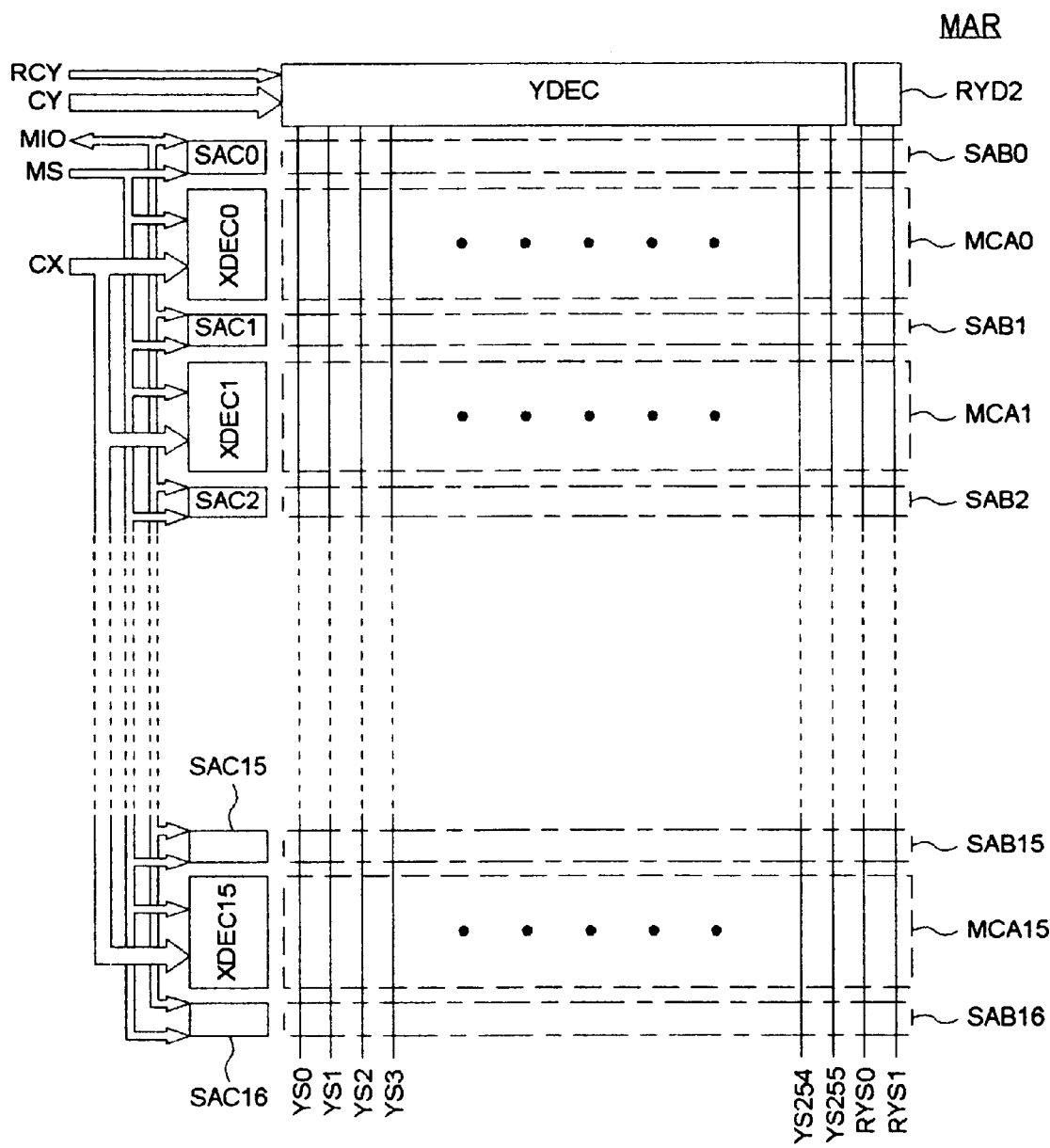
FIG. 13 is a diagram of an example of the construction of the memory array shown in FIG. 4.

FIG. 13 shows an example of the construction of the memory array MAR shown in FIG. 4. Here, the memory cell array in which memory cells are arranged in a matrix shape is divided into 16 mats MCA0~MCA15. On both sides of each mat, there are provided sense amplifiers SAB0~SAB16. In addition, row decoders XDEC0~XDEC15 are provided to face the mats MCA0~MCA15, respectively, and similarly sense amplifier control circuits SAC0~SAC16 to face the sense amplifiers SAB0~SAB16. Here, a column decoder YDEC and a redundant column driver RYD2 are provided common to the mats MCA0~MCA7, and selectively drive 256 column selection lines YS0~YS255 and two redundant column lines RYS0, RYS1. The column-side repair decision circuit YR shown in FIGS. 6 through 11 and the column pre-decoder YPD shown in FIG. 12 deal with the numbers of the column selection lines and redundant column selection lines. For example, the two compared decision results in FIG. 4 are provided because RCY0 and RDY1 are associated one to one with the redundant column selection lines RYSO and RYS1, respectively.

Figure 14:
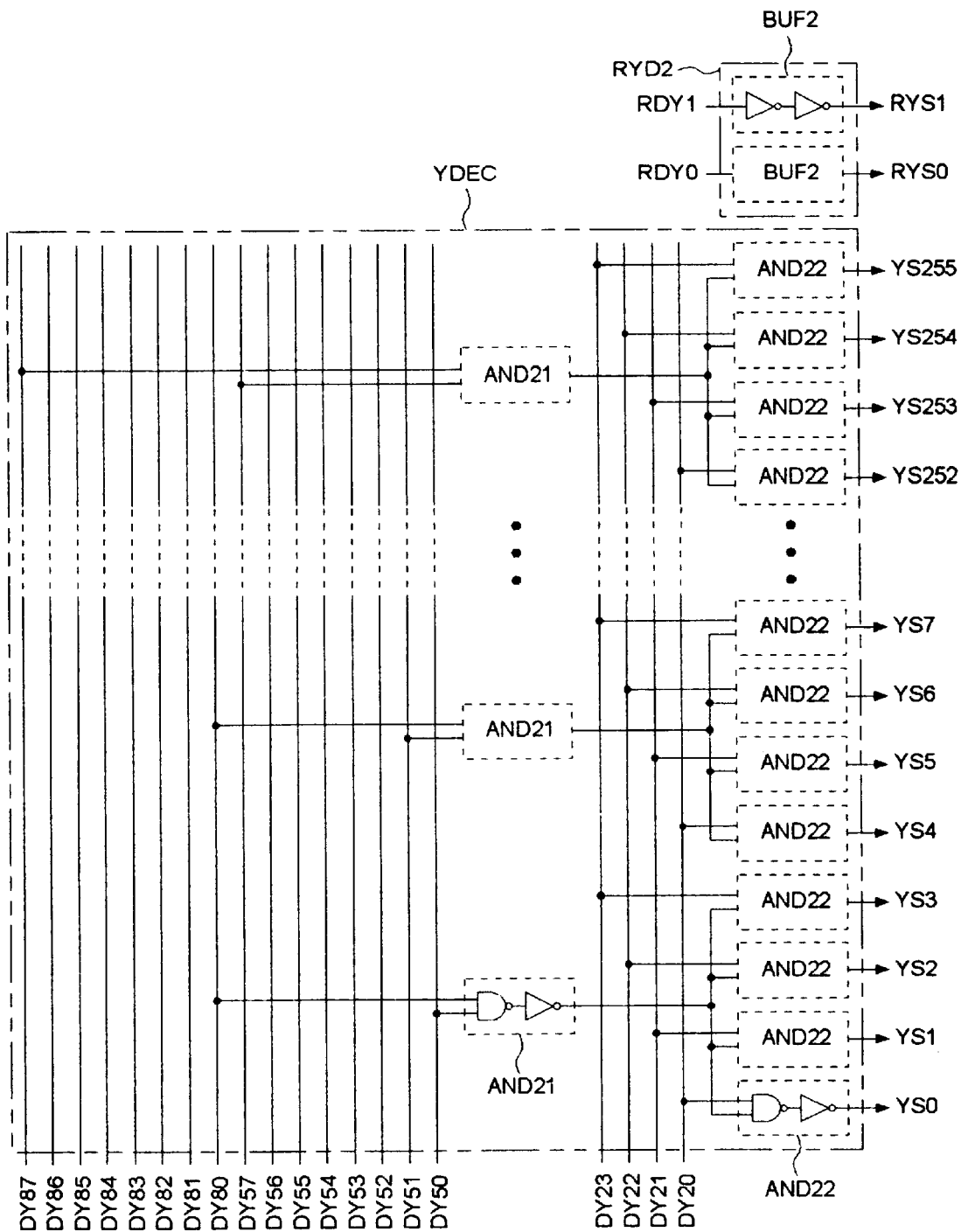
FIG. 14 is a diagram of an example of the construction of the column decoder shown in FIG. 9.

FIG. 14 shows an example of the construction of the column decoder YDEC and redundant column driver RYD2 shown in FIG. 9. The column decoder YDEC has a large number of dual-input AND gates AND21, AND22 each of which is formed of a NAND gate and an inverter in order to decode to select the column selection lines YS0~YS255. The column address signal CY20~CY23 resulting from pre-decoding the column address of 2 bits, and the column address signals CY50~CY57, CY80~CY87 each resulting from pre-decoding three bits are supplied to the column decoder. First, the AND gates AND21 take logic products of the column address signal CY50~CY57 and the column address CY80~CY87, and then the AND gates AND22 take logic products of the outputs from the AND gates AND21 and the column address CY20~CY23, thus decoding 7 bits so that a desired one of the 255 column selection lines YS0~YS255 can be selected. The redundant column driver RYD2 is formed of two buffer circuits BUF2 each of which has two inverters connected in series in order to drive the redundant column selection lines RYS0, RYS1.

Figure 15:
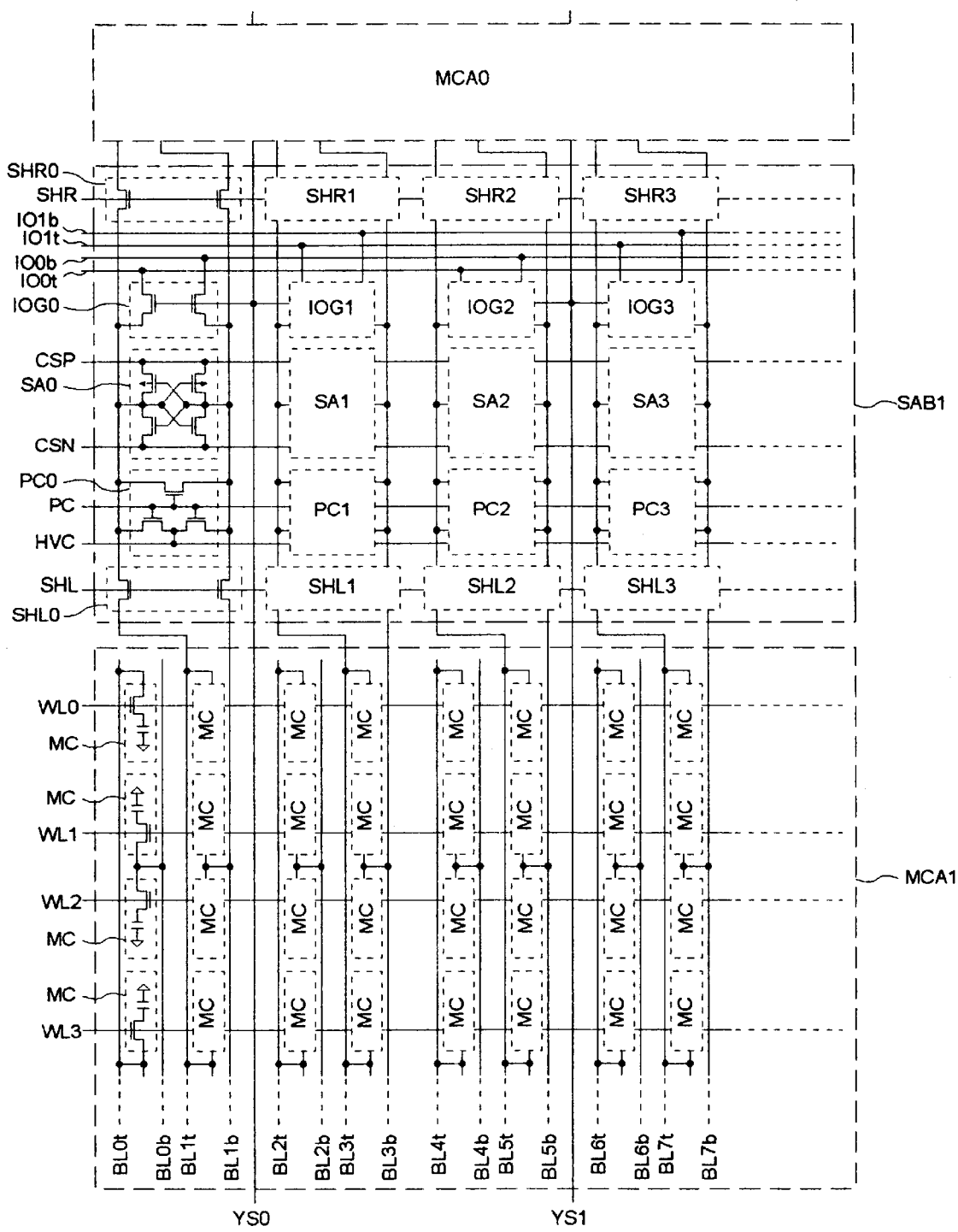
FIG. 15 is a diagram of an example of the construction of the sub-array and sense amplifier shown in FIG. 13.

FIG. 15 shows an example of the construction of the sense amplifier SAB1 and mat MCA1 shown in FIG. 13. The mat MCA1 has memory cells MC provided at the intersections of one parts of bit line pairs BL0$t$ and BL0$b$, BL0$t$ and BL0$b$, . . . and the word lines WL0, WL1, . . . in the so-called folded type bit line configuration. Each memory cell MC is a one-transistor one-capacitor type memory cell that is formed of one NMOS transistor and one accumulation capacitor. The sense amplifier unit SAB1 is shared by the two mats MCA0, MCA1, and is formed of shared gates SHL0, SHl1, SHR0, SHR1, . . . , pre-charge circuits PC0, PC1, sense amplifiers SA0, SA1, . . . , and input/output gates IOG0, IOG1, . . . The pre-charge circuits PC0, PC1, pre-charge the bit line pairs within the mats MCA0, MCA1 on both sides up to a pre-charge voltage HVC. The shared gates SHL0, SHL1, . . . , and SHR0, SHR1, connect the bit line pairs within either one of the mats MCA0, MCA1 and the sense amplifiers so as to separate the bit line pairs within the other mat. When any one of the word lines within the mat connected to the sense amplifiers is selectively driven, a signal is read out through each bit line pair BL0$t$ and BL0$b$, BL0$t$ and BL0$b$, . . . , and amplified by the sense amplifier SA0, SA1, . . . The input/output gate IOG0, IOG1, . . . is selected by the column selection line YS0, YS1, . . . to connect a desired sense amplifier to an input/output line pair IO0$t$ and IO0$b$, IO1$t$ and IO1$b$. Here, each column selection line is provided for every two sense amplifiers within the sense amplifier unit, or every four bit line pairs within the mat. When this column selection line is replaced by a redundant column selection line, the sense amplifier for receiving/transmitting data from/to the input/output line pair IO0$t$ and IO0$b$, IO1$t$ and IO1$b$ can be replaced so that a defective memory cell can be replaced, or repaired by a redundant memory cell.

Figure 16:
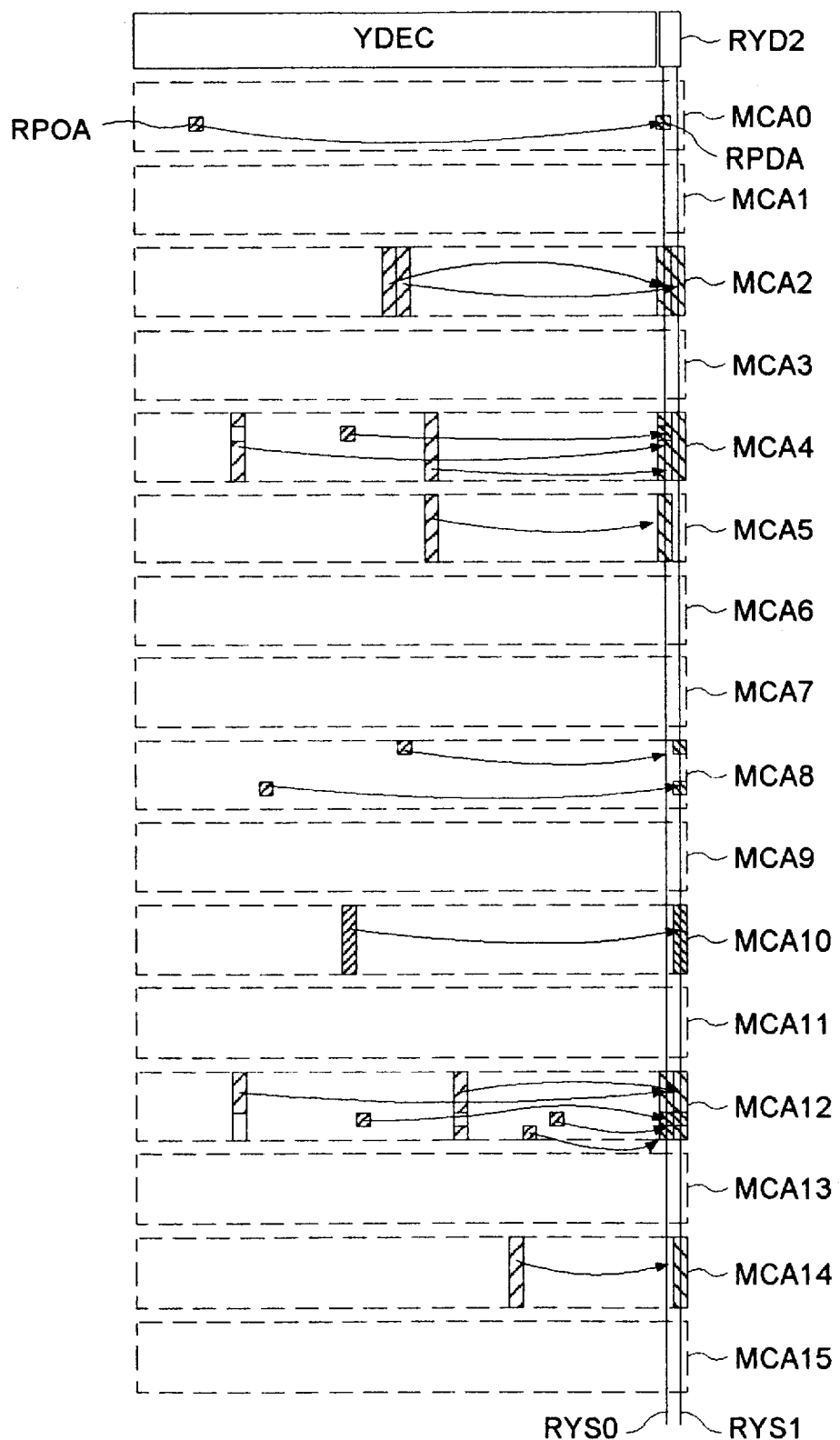
FIG. 16 is a diagram of an example of the replacement of a column selection line according to one embodiment of the invention.

FIG. 16 shows an example of the replacement of a column selection line in the above-mentioned construction. When a column selection line is replaced by a redundant column selection line, the bit line of each mat is replaced by a redundant bit line, and a memory cell group of a defective portion is replaced by a redundant memory cell group. The right-up shaded, or hatched region RPOA is replaced by the right-down shaded, or hatched region RPDA. The redundant column selection lines RYS0, RYS1 replace the column selection lines of eight places. In this case, block redundancy and smaller unit repair, or bit repair are mixed within one of the mats. In other words, in each of the mats, there are mixed repair of a block or blocks of one data line unit each selected by the column address signal, and repair of a bit or bits of a unit region of the intersection or intersections between a data line or data lines selected by the column address signal and a predetermined number of word lines. For example, in mat MCA0, a column selection line is replaced by a unit of 1/128 of the sub-array. This replacement is suitable for the repair of a defective memory cell since the so-called bit repair is achieved by using the row address comparator BXC1 shown in FIG. 4. In the mat MCA2, the column selection lines in a mat unit are replaced. This replacement can be controlled by use of the high-order row address comparator BXUC1 shown in FIG. 4, and thus it is suitable for the repair of defective bit line. As illustrated here, since the two successive column selection lines are replaced by the redundant column selection lines RYS0, RYS1, the short-circuit between bit lines can be repaired. Moreover, as shown in the mats MCA4, MCA5, since the same column selection-lines are replaced in the two successive mats, defective sense amplifiers can be repaired.

As shown in mat MCA4, since the bit repair is given priority so that the except-inside block redundancy can be made, the replacement equivalent to two bit-repair operations can be attained by use of the row address comparator BXC1 for bit repair and the high-order row address comparator BXUC1 for block redundancy. In the mat MCA8, two bit-repair operations can be performed in one mat. This replacement is effective if a redundant memory cell selected by the redundant column selection line is defective. In the mat MCA12, bit repair and except-inside block redundancy can also be performed by two redundant column selection lines RYS0, RYS1. Thus, the column-side defect repair decision circuit YR shown in FIG. 6 can repair up to ten defects within one mat by use of the eight row address comparators BXC1 for bit repair and the high-order row address comparator BXUC1 for redundant column selection.

When there are a large number of defective bit lines, block redundancy for mat unit can be performed in a maximum of eight mats as the redundant column selection line RYS1 makes block redundancy and except-inside block redundancy in five mats. In this illustrated example, the block redundancy in, for example, mat MCA10 is performed by use of the row address comparator BXC1 for bit repair.

Figure 17:
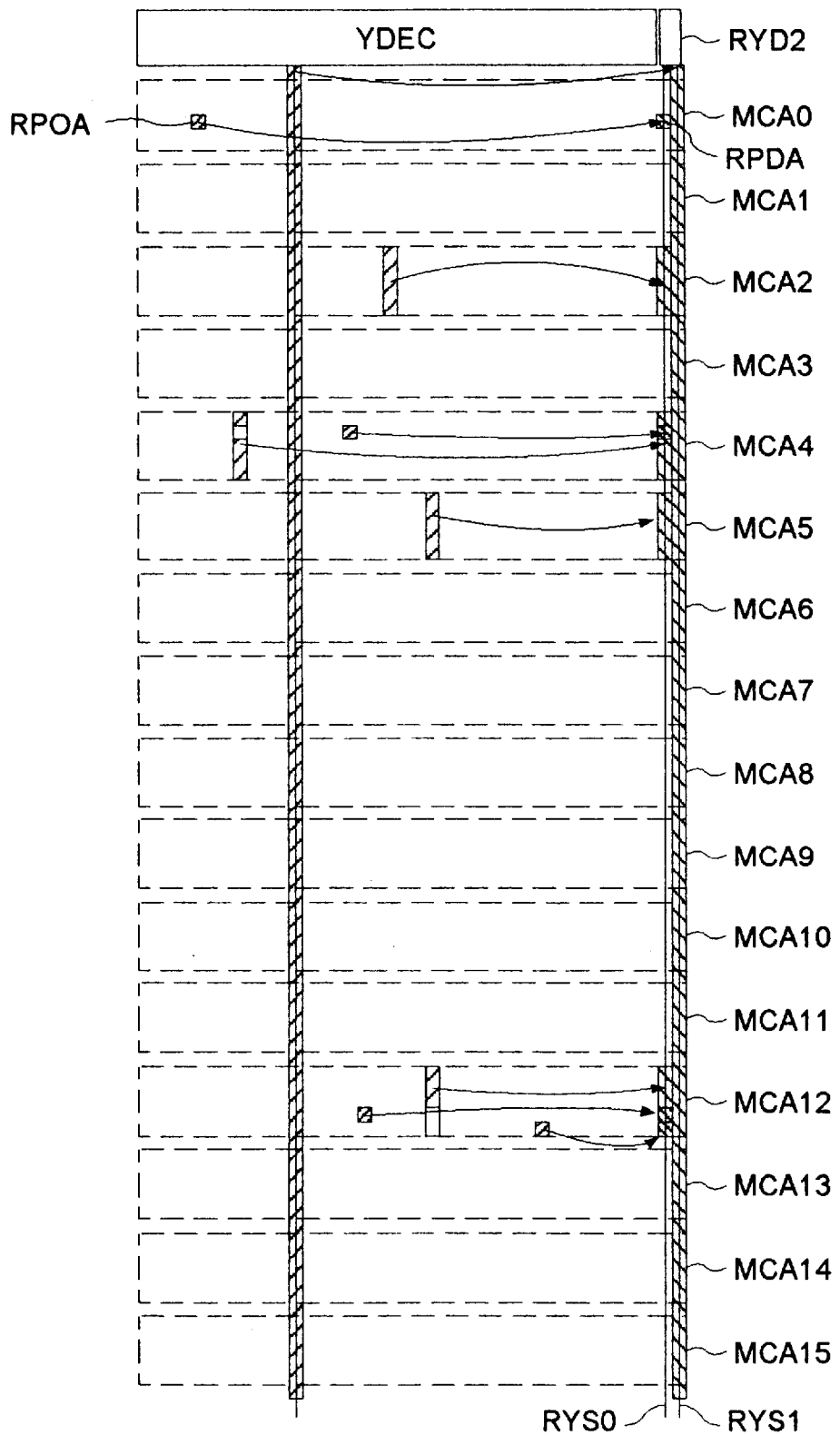
FIG. 17 is a diagram of another example of the replacement of the column selection line according to the embodiment of the invention.

FIG. 17 shows another example of the replacement of column selection line. Here, one column selection line is replaced by the redundant column selection line RYS1 irrespective of the row address. The defective column selection line or column decoder can be repaired by the so-called YS replacement. At this time, the redundant column selection line RYS0 is able to repair eight defects. In that case, as shown in the mats MCA4, MCA12, a plurality of defects can be repaired in one mat.

As described above, the column-side repair system of this embodiment is capable of flexible repair. Thus, the chip area is not increased because of a small number of fuses, and the yield is high because of high repair efficiency, so that the manufacturing cost of SDRAM can be reduced. Although specific values such as two redundant column selection lines relative to the 256 column selection lines have been shown here, other values can of course be used. Although the basic unit of one-mat block redundancy can be extended to two mats as shown in the above construction, the same idea can be applied to the case in which a plurality of mats such as two mats are used as a basic unit for block redundancy and extended to a plurality of times as large as the unit. While SDRAM is given as an example, this embodiment pertains to the redundancy of memory array, and brings about the same effect to other DRAMs such as fast page mode. Moreover, this embodiment can be applied to other memories than DRAM. The same is true in the embodiments given below.

<Embodiment 4>

Another embodiment of the column-side block redundancy will be described with reference to FIGS. 18 through 21.

The feature of this embodiment is that when the fuse set capable of bit repair is applied to two redundant column selection lines, which one of the redundant column selection lines is to be selected can be decided by programming with fuses. The construction of the whole SDRAM shown in FIG. 4, the column pre-decoder YPD shown in FIG. 12 and the construction of memory array MAR shown in FIGS. 13 through 15 are assumed to be the same as described with reference to FIGS. 4 through 17.

Figure 18:
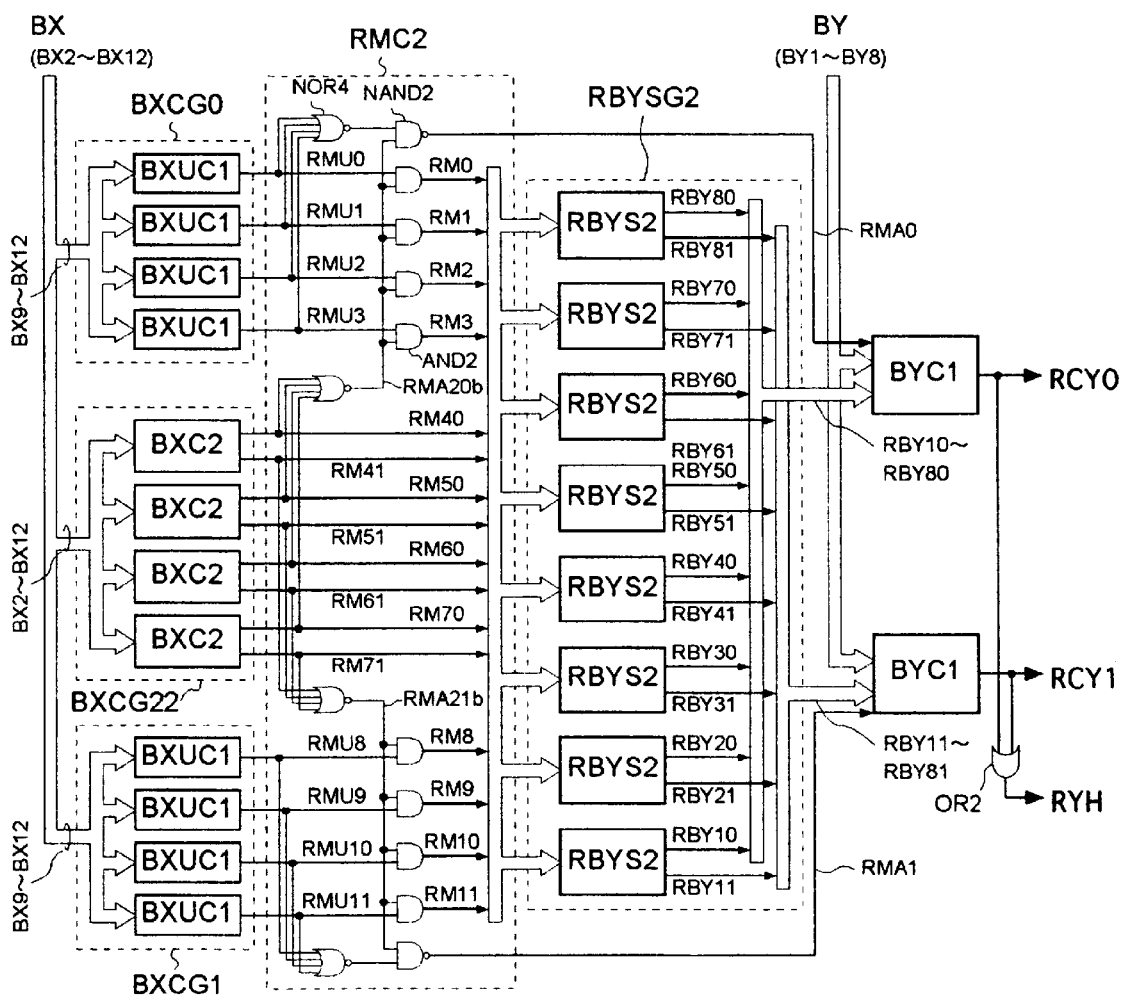
FIG. 18 is a diagram of another embodiment of a column-side block redundancy according to the invention.

FIG. 18 shows another example of the construction of the column-side repair circuit. This example is used as YR in FIG. 4 like that shown in FIG. 6. This construction produces two compared decision results RCY0, RCY1 and can control a maximum of 8 replacements for each, and up to a total of 12 replacements. This column-side repair circuit has three row address comparator groups BXCG0, BXCG1, BXCG22, a control circuit RMC2 for row address compared result, a repair column address selector group RBYSG2, two column address comparators BYC1, and a dual-input OR gate OR2.

Like FIG. 6, each of the row address comparator groups BXCG0, BXCG1 is formed of four high-order row address comparators BXUC1. Each row address comparator BXUC1, as constructed as shown in FIG. 7, stores a repair address of four bits and compares with the four more-significant bits BX9~BX12 of the input row address BX to produce row address compared results RMU0~RMU3, RMU8~RMU11. The row address comparator group BXCG22 is formed of four row address comparators BXC2. Each row address comparator BXC2 stores a repair row address of 11 bits, and compares with the eleven bits BX2~BX12 of the input row address BX to produce row address compared result RM40~RM70, RM41~RM71. Here, the row address compared result RM40~RM70 gets involved with the compared decision result RCY0, and the row address compared result RM41~RM71 with the compared decision result RCY0. The control circuit RMC2 is formed of four four-input NOR gates NOR4, two dual-input NAND gates NAND2, and eight dual-input AND gates AND2. The logic sum of the row address compared result RMU0~RMU3 and RM40~RM70 is produced on output RMA0, and the logic sum of RMU8~RMU11 and RM41~RM71 on output RMA1. The output signals RMA0, RMA1 are applied to two column address comparators BYC1, respectively, and indicate the presence or absence of repair column address compared with the input row address BX. When the row address compared result RM40~RM70 is all '0', the node RMA20$b$ becomes '1', so that the row address compared result RMU0~RMU3 is produced on the row address decision result RM0~RM3. If any one of the row address compared result RM40~RM70 is '1', the node RMA20$b$ becomes '0', so that the row address decision result RM0~RM3 is '0'. Similarly, the node RMA21$b$ controls the row address decision result RM8~RM11. The repair column address selector group RBYSG2 is formed of eight address selectors RBYS2. The eight address selectors RBYS2 respectively select one bit of each of the repair column addresses RBY10~RBY80, RBY11~RBY81 according to the input row address decision results RM0~RM3, RM8~RM11 and row address compared results RM40~RM70, RM41~RM71. The fuse set for storing the address space for one replacement is formed of one fuse of one address comparator BXUC1 or BXC2 and eight fuses of eight address selectors RBYS2. The column address comparator BYC1 is constructed as shown in FIG. 11. When the control signal RMA0, RMA1 is '1', the comparators compare the repair column address RBY10~RBY80, RBY11~RBY81 with the column address BY (BY1~BY8) to produce the compared decision result RCY0, RCY1. The dual-input OR gate OR2 takes a logic sum of the two compared decision results RCY0, RCY1 to produce the column-side repair decision result RYH.

Figure 19:
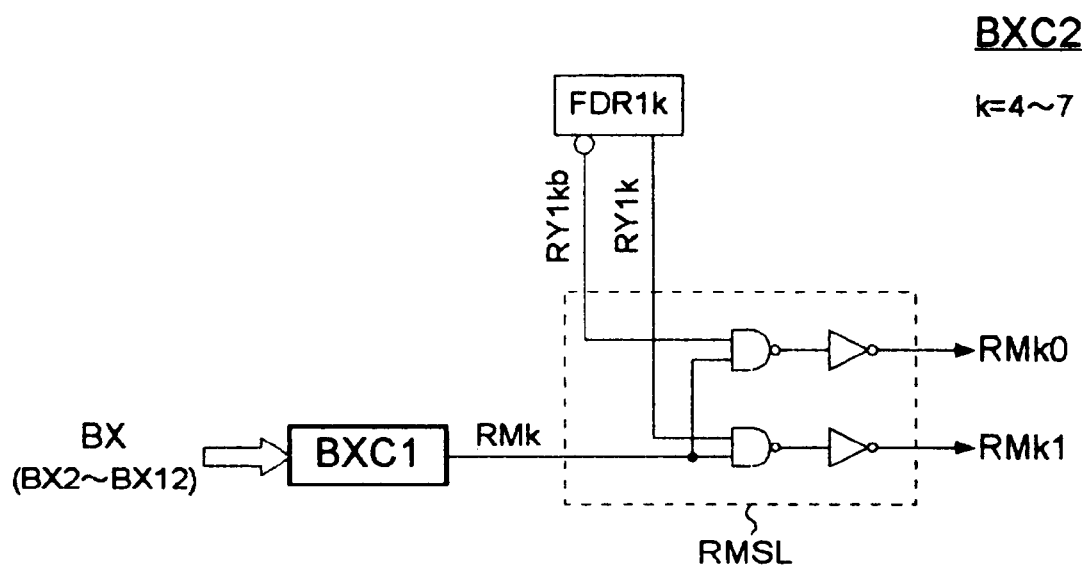
FIG. 19 is a diagram of an example of the construction of the row address comparator shown in FIG. 18.

FIG. 19 shows an example of the construction of the row address comparator BXC2 shown in FIG. 18. This comparator is formed of the row address comparator BXC1 shown in FIG. 8, a fuse decision circuit FDR1$k$ and a selector RMSL. It has a total of 13 fuse decision circuits as a result of the addition of the 12 fuse decision circuits FDB$k$, FDX2$k$~FDX12$k$ within the comparator BXC1. The selector RMSL is formed of two dual-input NAND gates, and two inverters. This selector receives the output RM$k$ from the row address comparator BXC1, and produces it as one of the two row address compared results RM$k$0 and RM$k$1 with the other one made '0' in accordance with the outputs RY1$k b$, RY1$k$ from the fuse decision circuit FDR1$k$. Thus, the row address comparator BXC1 that selects two outputs can be achieved without increasing the circuit scale.

Figure 20:
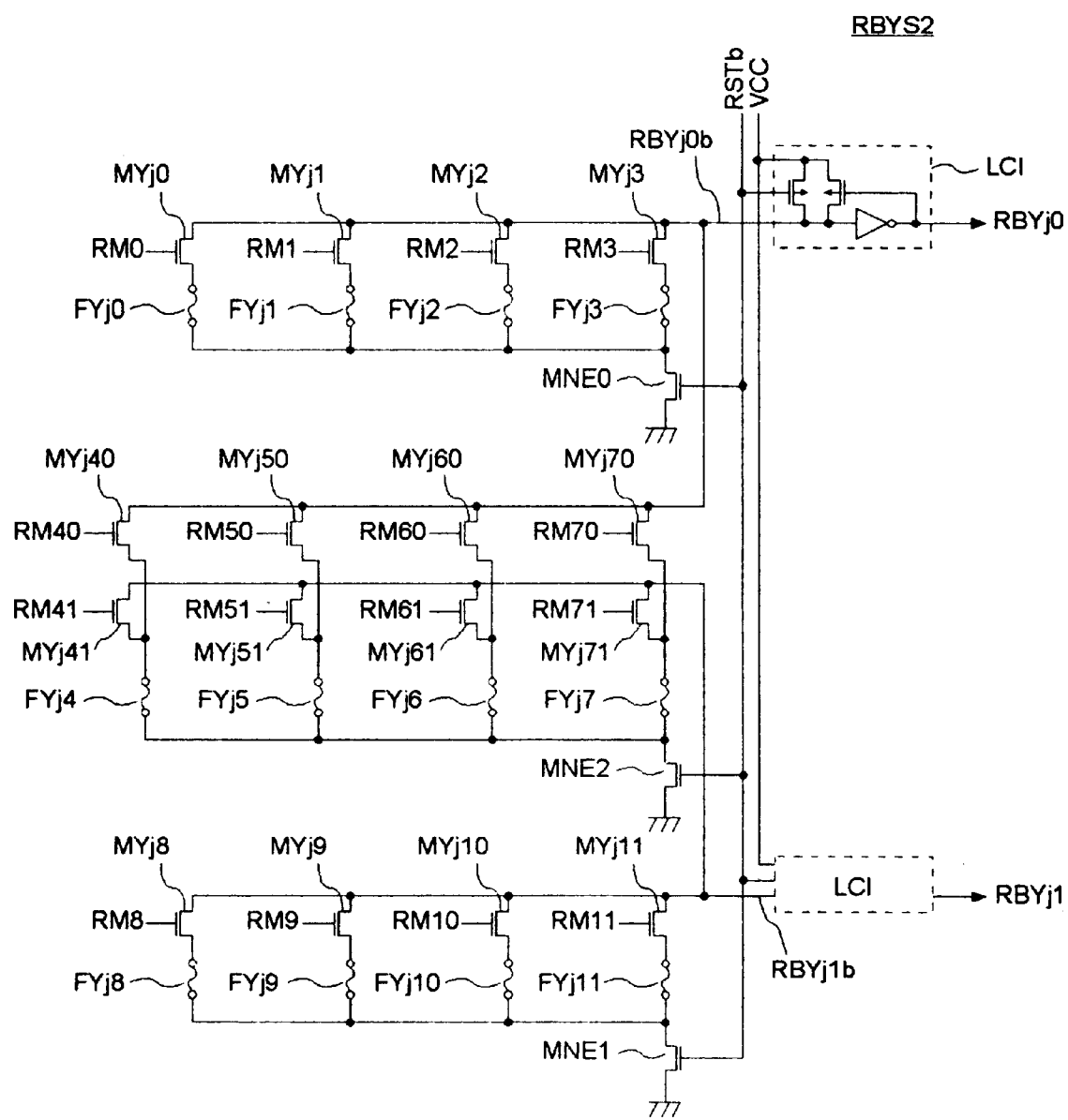
FIG. 20 is a diagram of an example of the construction of the repair column address selector shown in FIG. 18.

FIG. 20 shows an example of the construction of the address selector RBYS2 shown in FIG. 18. The address selector RBYS2 has 12 fuses FY$j$0~FY$j$11, 15 NMOS transistors MNE0, MNE2, MNE1, MY$j$0~MY$j$3, MY$j$40~MY$j$70, MY$j$41~MY$j$71, MY$j$8~MY$j$11, and two inverters LCI with latch function. Each inverter LCI with latch function is formed of two PMOS transistors and an inverter like that shown in FIG. 10. This construction is responsive to the row address decision results RM0~RM3, RM8~RM11, and row address compared results RM40~RM70, RM41~RM71 to select the repair column address stored in the fuses. The fuses of the row address comparators BXUC1, BXC2 are set so that only one of the row address decision results RM0~RM3, RM8~RM11, and row address compared results RM40~RM70, RM41~RM71 can be made high level with the other ones made low level or that all the results can be made low level. Moreover, two bits, for example, RM40 and RM41 of the row address compared results RM40~RM70, RM41~RM71 produced from the row address comparator BXC2 shown in FIG. 19 are respectively high level and low level or both row level.

In the standby mode, the reset signal RSTb is made low level, so that the nodes RBYj0b, RBYj1b are made high level, and that the output nodes RBYj0, RBYj1 are made low level. When the reset signal RSTb becomes high level, the NMOS transistors MNE0~MNE2 are turned on. Thus, the outputs RBYj0, RBYj1 are decided depending upon whether the nodes RBYj0b, RBYj1b are discharged or not through the NMOS transistors and fuses. If the row address decision result RM0 and row address compared result RM41 are high level with the other ones being low level, the node RBYj0b is discharged to low level as long as the fuse FYj0 is not blown out. Thus, the inverter LCI with latch function controls the output node RBYj0 to be high level. If the fuse FYj0 is blown out, the node RBYj0b is high level, and the output RBYj0 is kept low level by the inverter LCI with latch function. If the fuse FYj4 is not blown out, the output node RBYj1 is high level. If the fuse FYj4 is blown out, the output node RBYj1 is kept low level.

A more complicated logic than the repair column address selector RBYS1 shown in FIG. 10 can be accomplished with a small circuit scale using dynamic composite gates that include fuses. This address selector RBYS2 can be formed on a small layout area that is smaller than twice the layout area of the repair column address selector RBYS1 shown in FIG. 10.

Figure 21:
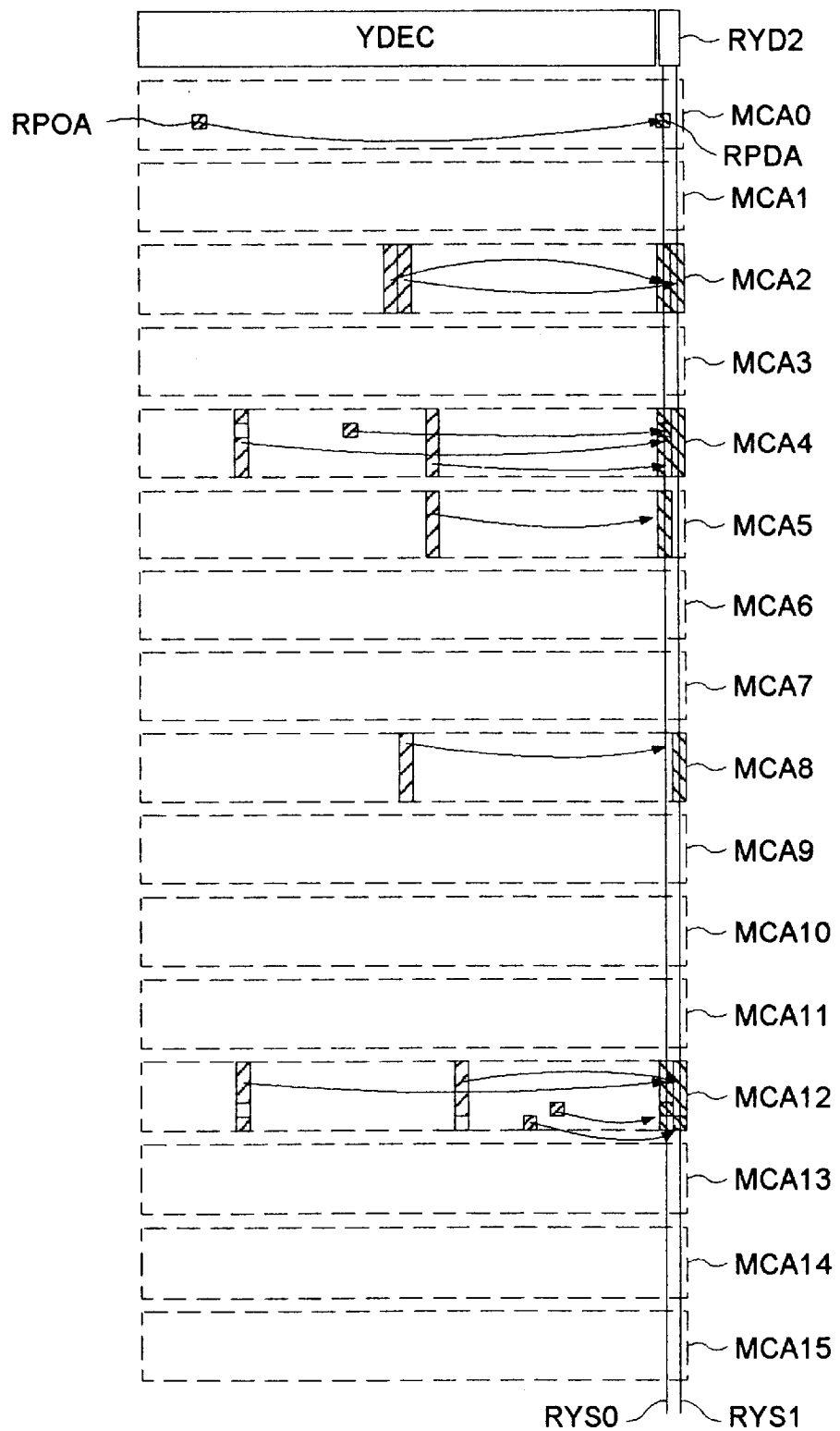
FIG. 21 is a diagram of an example of the replacement of a column selection line according to the embodiment of the invention.

FIG. 21 shows an example of the replacement of column selection line in the case of using the column repair decision circuit shown in FIG. 18. Like the regions shown in FIGS. 16 and 17, the right-up hatched regions RPOD are replaced by the right-down hatched regions RPDA.

The redundant column selection lines RYS0, RYS1 replace column lines at a total of 12 places. In these column selection lines, there are mixed block redundancy of one mat unit and bit repair of smaller unit. As shown in the mat MCA4, bit repair is given priority so that except-inside block redundancy can be made, and thus replacement equivalent to two bit-repair operations can be achieved by use of the row address comparator BXC2 for bit repair and the high-order row address comparator BXUC1 for block redundancy. Here, this replacement is performed by the redundant column selection line RYS0, and the normal block redundacy is made by the redundant column selection line RYS1. Since the column repair decision circuit shown in FIG. 18 can assign the four-fuse set for bit repair to any one of the two redundant column lines, a maximum of five bit-repair operations can be performed in a mat in which block redundancy is made due to defective bit line. As illustrated in the mat MCA12, bit repair and except-inside block redundancy can be performed by use of both the two redundant column selection lines RYS0, RYS1.

This embodiment also attains the example of replacement shown in FIG. 17. As shown in FIG. 17, one column selection line is replaced by the redundant column selection line RYS1. At this time, by assigning the four row address comparators BYC2 to the selection of the redundant column selection line RYS0, it is possible to repair defects of eight places by the redundant column selection line RYS0.

According to the column-side repair system of this embodiment, since the high-freedom fuse set for bit repair can be assigned to any one of the redundant column lines, very flexible repair can be performed. Particularly in the construction of this embodiment, the probability that the fuse set becomes useless is low, or the fuse set can be effectively used if the number of defective memory cells is small, which case is suited to bit repair.

<Embodiment 5>

Another embodiment of the column-side repair circuit will be described with reference to FIGS. 22 through 24. The feature of this embodiment is that the repair row address for block redundancy is sorted and stored in a particular order so that the number of fuses for storing the repair row address can be reduced.

The construction of the whole SDRAM shown in FIG. 4, the column pre-decoder YPD shown in FIG. 12, and the construction of memory array MAR shown in FIGS. 13 through 15 are assumed to be the same as the system described with reference to FIGS. 4 through 17.

Figure 22:
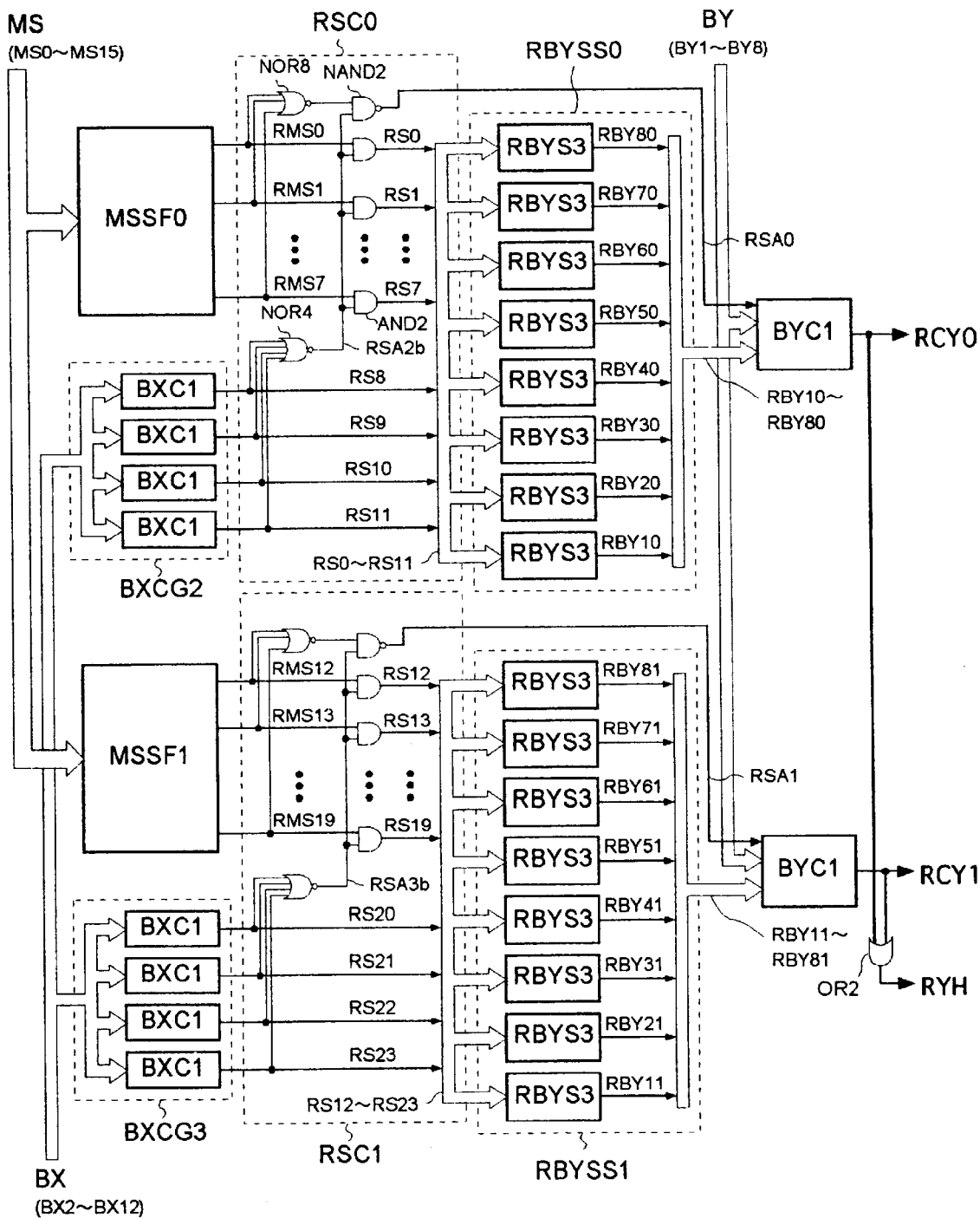
FIG. 22 is a diagram of another embodiment of a column-side repair circuit according to the invention.

FIG. 22 shows this embodiment of the column-side repair circuit. This repair circuit is used as YR shown in FIG. 4 like the column-side repair circuit shown in FIG. 6. However, a mat selection signal MS as the output from the low pre-decoder XPD is also fed to this column-side repair circuit. Here, two compared decision results RCY0, RCY1 are produced each of which can control a maximum of 12 replacements. Two address shifters MSSF0, MSSF1 are provided instead of the row address comparator groups BXCG0, BXCG1 within the column-side repair circuit YR shown in FIG. 6. The other circuits are the same as shown in FIG. 6. That is, it also has two row address comparator groups BXCG2, BXCG3, two control circuits RSC0, RSC1 for row address compared result, two repair column address selector groups RBYSS0, RBYSS1, two column address comparators BYC1, and dual-input OR circuit OR2.

The address shifters MSSF0, MSSF1, as will be described later, sort the repair row address for block redundancy in a particular order, allow it to be stored in fuses, and shift the mat selection signal MS (MS0~MS15) fed according to the address to produce row address compared results RMS0~RMS7, RMS12~RMS19. Like the construction shown in FIG. 6, the row address comparator groups BXCG2, BXCG3 each have four row address comparators BXC1. Each row address comparator BXC1 is constructed as shown in FIG. 8. They each store one bit of the repair row address, and compare with the eleven bits BX2~BX12 of the input row address BX to produce row address compared results RS8~RS11, RS20~RS23. Each of the control circuits RSC0, RSC1 has an eight-input NOR gate NOR8, a four-input NOR gate NOR4, a dual-input NAND gate NAND2 and eight dual-input AND gates AND2. They are different from the control circuits RMC0, RMC1 shown in FIG. 6 in the number of input row address compared results, but operate in the same way as those circuits. In other words, the logic sum of row address compared results RMS0~RMS7 and RS8~RS11 is produced as output RSA0, and the logic sum of row address compared results RMS12~RMS19 and RS20~RS23 as output RSA1. In addition, if all the row address compared result RS8~RS11 is '0', the node RSA2b becomes '1', so that the row address compared result RMS0~RMS7 is produced as the row address decision result RS0~RS7. If any one of the row address compared result RS8~RS11 is '1', the node RSA2b becomes '0', so that the row address decision result RS0~RS7 is all '0'. Similarly, the node RSA3b controls the row address decision result RS12~RS19. Each of the repair column address selector groups RBYSS0, RBYSS1 is formed of eight address selectors RBYS3. The address selector RBYS3 can be constructed in the same way as the address selector RBYS1 shown in FIG. 10 though the number of input row address decision results is different. Each selector selects one bit of the repair column addresses RBY10~RBYB0, RBY11~RBY81. In some cases, it is possible that the twelve input signals are divided into two groups, and that both groups are logically summed after each group undergoes dynamic composite gate logic. In that case, although the circuit scale is somewhat large, the operation speed and noise margin can be improved. The column address comparator BYC1 is constructed as shown in FIG. 11. When the control signal RMA0, RMA1 is '1', it compares the repair column address RBY10~RBY80, RBY11~RBY81 with the column address BY (BY1~BY8) to produce the compared decision result RCY0, RCY1. The dual-input OR gate OR2 takes a logic sum of the two compared decision results RCY0, RCY1 to produce the column-side repair decision result RYH.

Figure 23:
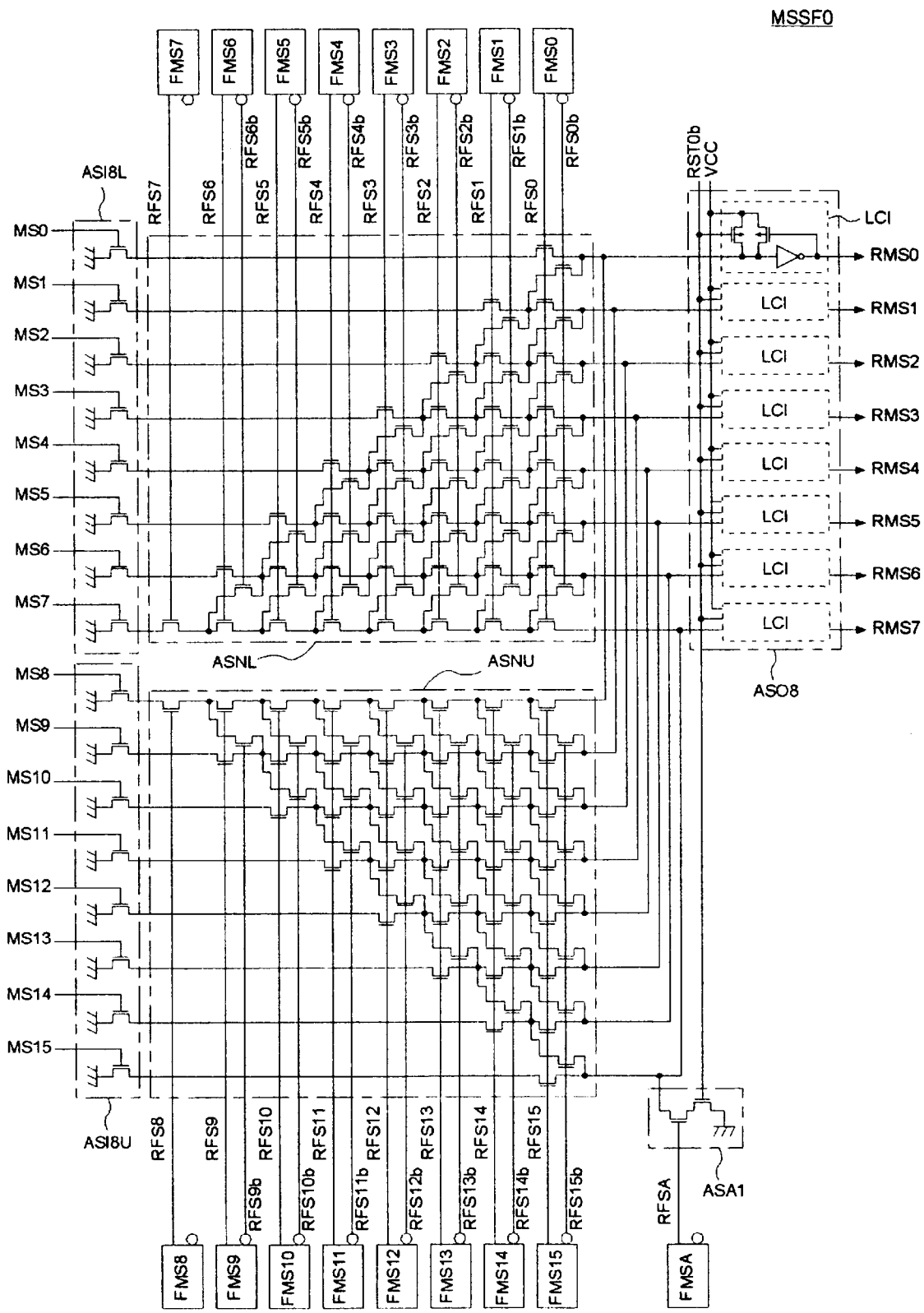
FIG. 23 is a diagram of an example of the construction of an address shifter.

FIG. 23 shows an example of the construction of the address shifter MSSF0 using NMOS pass transistors. The address shifter MSSF1 also has the same construction. The input mat selection signal MS (MS0~MS15) is divided into two groups MS0~MS7, MS8~MS15, and a pass transistor portion is provided for each group. The address shifter MSSF0 has an input port ASI8L for the input mat selection signal MS0~MS7, an input portion ASI8U for the input MS8~MS15, an output portion ASO8 that produces a compared result RMS0~RMS7 of repair mat address, an 8-input, 8-output pass transistor portion ASNL provided between the input portion ASI4L and the output portion ASO8, an 8-input, 8-output pass transistor portion ASNU provided between the input portion ASI8U and the output portion ASO8, a pass transistor portion ASA1 for attaining YS replacement, and 17 fuse decision circuits FMS0~FM15, FMSA.

The input portion ASI8L, ASI8U is formed of eight NMOS transistors with the sources connected to ground potential VSS. The pass transistor portion ASNL, ASNU is formed of 64 NMOS transistors. The pass transistor portion ASNL is controlled by the fuse decision results RFS7~RFS0, RFS6b~RFS0b from the fuse decision circuits FMS7~FMS0, and the pass transistor portion ASNU by the fuse decision results RFS8~RFS15, RFS9b~RF15b from the fuse decision circuits FMS8~FMS15. The pass transistor portion ASAL is formed of two NMOS transistors and controlled by the fuse decision result RFSA from the fuse decision circuit FMSA and the reset signal RST0b. The outputs from the pass transistor portions ASNL, ASNU and ASA1 are logically summed by wired OR at the input terminals of the output portion ASO8. The output portion ASO8 is formed of eight level-holding inverters LCI.

The operation is performed as follows. At the time of row-side operation, the reset signal RST0b is made high level, activating the level-holding inverters LCI within the output portion ASO8. When any one of the mat selection signals MS0~MS7 becomes high level, the corresponding NMOS transistor within the input portion ASI8L is conductive. If a current path to the output portion ASO8 is formed in the pass transistor portion ASNL, the output becomes high level. At this time, since the mat selection signals MSB~MS15 are all low level, any current path is not formed through the input portion ASI8U and the pass transistor portion ASNU. On the other hand, any one of the mat selection signals MS8~MS15 becomes high level, the corresponding NMOS transistor within the buffer portion ASI8U is conductive. If a current path to the output portion ASO8 is formed in the past transistor portion ASNU, that output becomes high level. At this time, since the mat selection signals MS0~MS7 are all low level, no current path is formed through the input portion ASI8L and pass transistor portion ASNL. The pass transistor portion ASNL is wired to allot ones, selected according to the fuse decision result, of the mat selection signals MS0~MS7, in the order of RMS0, RMS1, . . . , RMS7. The pass transistor portion ASNU is wired to allot ones, selected according to the fuse decision result, of the mat selection signals MS15, MS14, . . . , MS8, in the reverse order of RMS7, RMS6, . . . , RMS0. Therefore, if the fuse decision circuits are set at correct conditions so as to store a total of eight or below mat selection signals, two or more mat selection signals are never allotted to the same address shifter output. If the fuse decision result RFSA from the fuse decision circuit FMSA is high level, the compared result RMS becomes high level irrespective of the mat selection signals MS0~MS15.

Thus, by using the NMOS pass transistor logic, it is possible to form the address shifter with a small number of elements. The three-terminal switch shown in FIG. 2 can be attained by two NMOS transistors to which complementary fuse decision results are applied. Since the level-holding inverter LCI produces low level if the input is open, the pass transistors that transmit logic 0 are omitted, so that the number of elements can be reduced. In addition, since the pass transistor portion is provided for each of the two groups in which the sixteen mat selection signals MS0~MS15 are divided, the shifter can be formed by two 8-input, 8-output pass transistor portions so that the number of elements and the occupying area can be reduced as compared with the use of 16-input, 8-output pass transistor portion. Since the address shifter, which has a large number of NMOS transistors provided to constitute signal paths, can be arranged not to be critical pass of access time, the delay time can be neglected. Moreover, since the pass transistor gates within the pass transistor portion ASNL, ASNU are all supplied with fuse decision results, or predetermined values, there is no fear that erroneous operation is caused by the stray capacitance within the pass transistor portion ASNL, ASNU. Also, here, since the number of the NMOS transistors connected in series between the level-holding inverter and the ground potential VSS is reduced by using the two separate pass transistor portions, stable operation with less delay can be performed.

Figure 24:
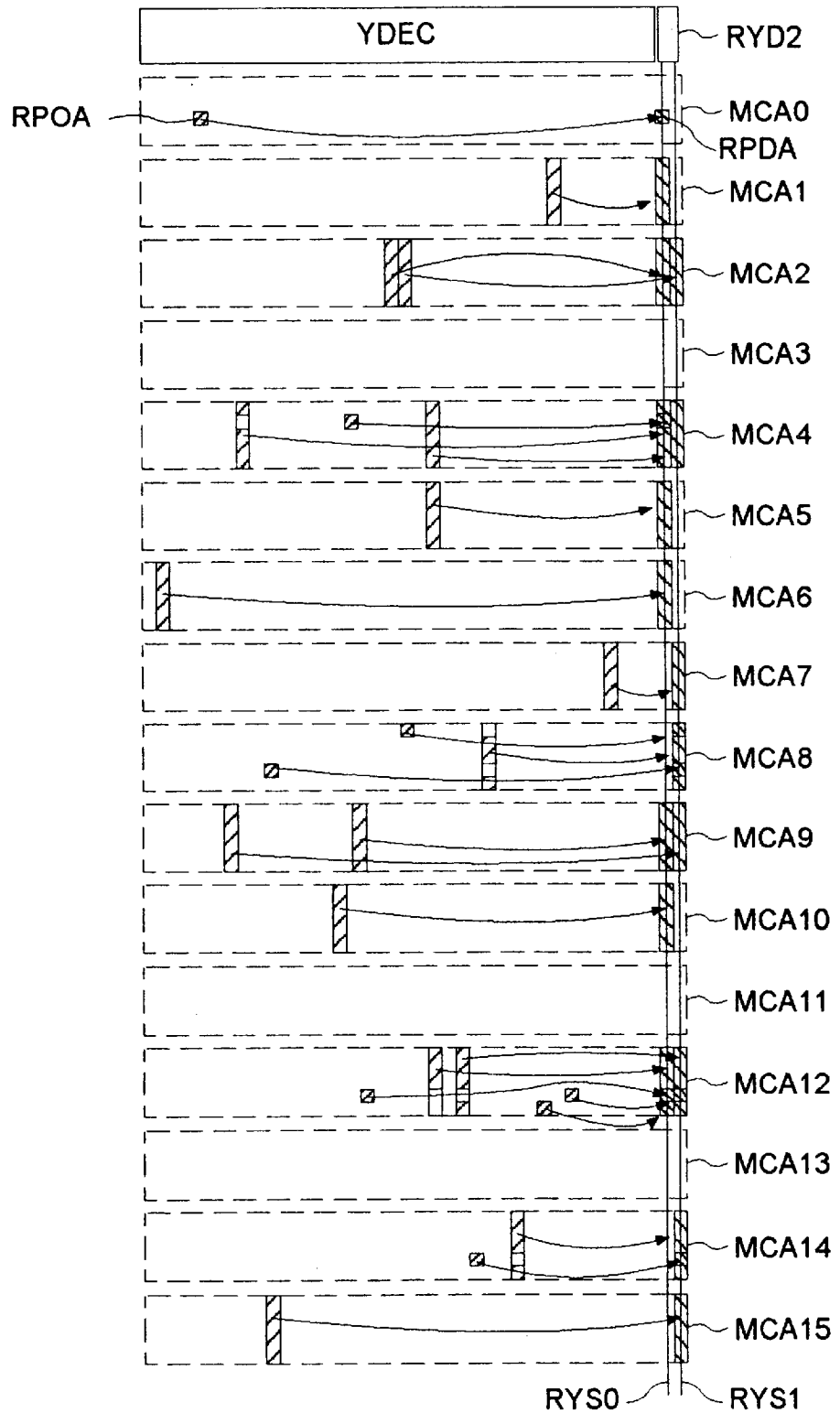
FIG. 24 is a diagram of an example of the replacement of a column selection line according to the embodiment of the invention.

FIG. 24 shows an example of the replacement of column selection line in this embodiment. Like the replacement shown in FIG. 16, the right-up hatched areas RPOA are replaced by the right-down hatched regions RPDA. The redundant column selection lines RYS0, RYS1 each replace column selection lines at 12 places. There are mixed block redundancy of one mat unit, and bit repair of smaller unit. As shown in the mat MCA4, the bit repair is given priority so that except-inside block redundancy can be performed, and thus replacement equivalent to two bit repair operations can be achieved. Here, block redundancy including except-inside block redundancy is performed in eight mats by each redundant column selection line. The row address comparison for 8 replacements is performed by the address shifter shown in FIG. 23.

Seventeen fuse decision circuits are used in the address shifter shown in FIG. 17. Since the address comparator BXUC1 shown in FIG. 7 uses five fuse decision circuits, use of eight address comparators BXUC1 needs a total of 40 fuse decision circuits. This embodiment using the address shifter can achieve the row address comparing function equivalent to that by less than half the number of fuse decision circuits. Also, the number of transistors used in the address shifter is smaller than that in the eight address comparators BXUC1. In this embodiment, the number of fuses in the fuse set is increased by making effective use of this feature.

The system, which is used in this embodiment, for sorting and storing the repair address in a particular order is suitable for the case in which different repair is made for each replacement. However, if it is allowed to use the same repair address for a plurality of replacements, the construction for that case becomes complicated. Therefore, although that system is suitable for storing the repair row address in the column-side block redundancy of mat unit, its construction becomes complex in bit repair. According to the invention, since the bit repair is given priority over block redundancy so that the except-inside block redundancy can be introduced, bit repair and block redundancy can be mixed, and the number of fuses is reduced for sorting and storing the repair mat selection signal in a particular order, and storing the repair row address.

<Embodiment 6>

Another embodiment of the column-side repair circuit will be described with reference to FIGS. 25 through 27. The feature of this embodiment is that the repair row address for block redundancy is sorted and stored in a particular order and that the number of fuses for storing the repair row address is reduced.

The construction of the whole SDRAM shown in FIG. 4, the column pre-decoder YPD shown in FIG. 12, and the construction of the memory array MAR shown in FIGS. 13 through 15 are assumed to be the same as the system described with reference to FIGS. 4 through 17.

Figure 25:
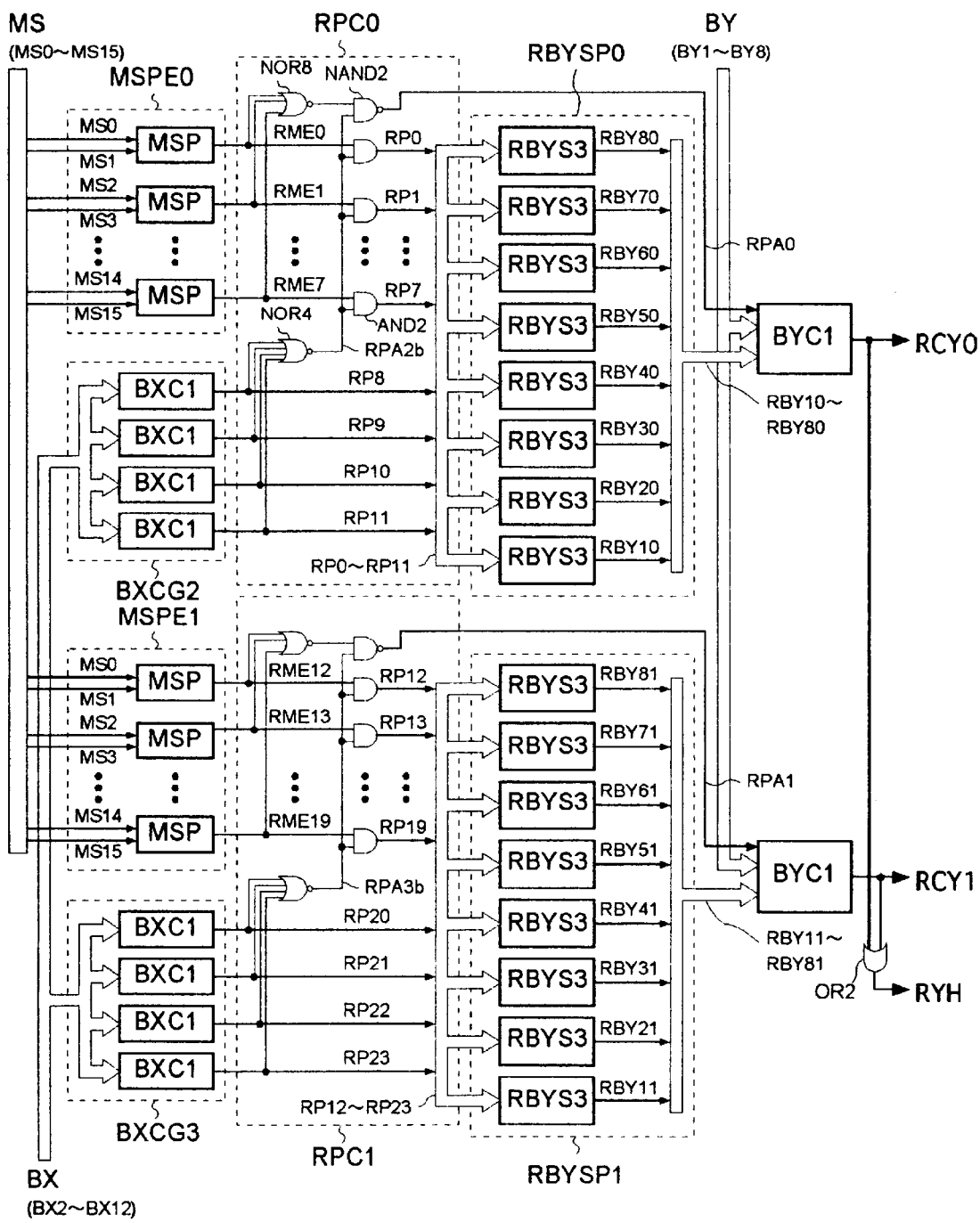
FIG. 25 is a diagram of still another embodiment of a column-side repair circuit according to the invention.

FIG. 25 shows this embodiment of the column-side repair circuit. Like the column-side repair circuit shown in FIG. 22, it also receives the mat selection signal MS produced from the row pre-decoder XPD, and is used as the YR shown in FIG. 4. Here, too, there is shown the construction in which block redundancy and bit repair are mixed, and two compared decision results RCY0, RCY1 are produced each of which can control a maximum of 12 replacements. However, the replacement unit for block redundancy is two mats. Instead of the address shifter in the column-side repair circuit shown in FIG. 22, two OR circuit groups MSPE0, MSPE1 are provided. Each of the OR circuit groups MSPE0, MSPE1 is formed of eight mat selection signal OR circuits MSP. The other elements are the same as shown in FIG. 22. That is, each OR circuit group also has two row address comparator groups BXCG2, BXCG3, two control circuits RPC0, RPC1 for row address compared results, two repair column address selector groups RBYSP0, RBYSP1, two column address comparators BYC1, and dual-input OR gate OR2. The control circuits RPC0, RPC1, and repair column address selector groups RBYSP0, RBYSP1 have the same construction as the control circuits RSC0, RSC1, and repair column address selector groups RBYSS0, RBYSS1 shown in FIG. 22, and operate in the same way. The column address comparator BYC1 and dual-input OR gate OR2 also operate in the same way as mentioned previously.

Figure 26:
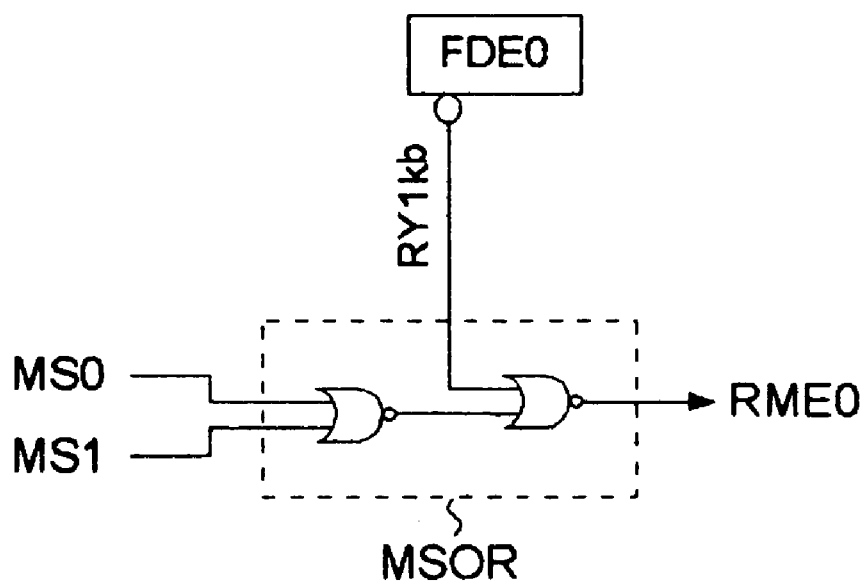
FIG. 26 is a diagram of an example of the construction of a mat selection signal OR gate according to the embodiment of the invention.

FIG. 26 shows an example of the construction of the mat selection signal OR circuit MSP. Here, it is supplied with mat selection signals MS0, MS1 and produces a repair decision purpose mat selection signal RME0. The mat selection signal OR gate MSP is formed of a fuse decision circuit FDE0, and a logic circuit MSOR that has two dual-input NOR gates. When the fuse decision circuit FDE0 has its fuse blown out to produce fuse decision result RY1kb of '0', the logic sum of the mat selection signals MS0, MS1 is produced as the repair decision purpose mat selection signal RME0. If the fuse decision result RY1kb is '1', the mat selection signal RME0 becomes '0' irrespective of the mat selection signals MS0, MS1.

Figure 27:
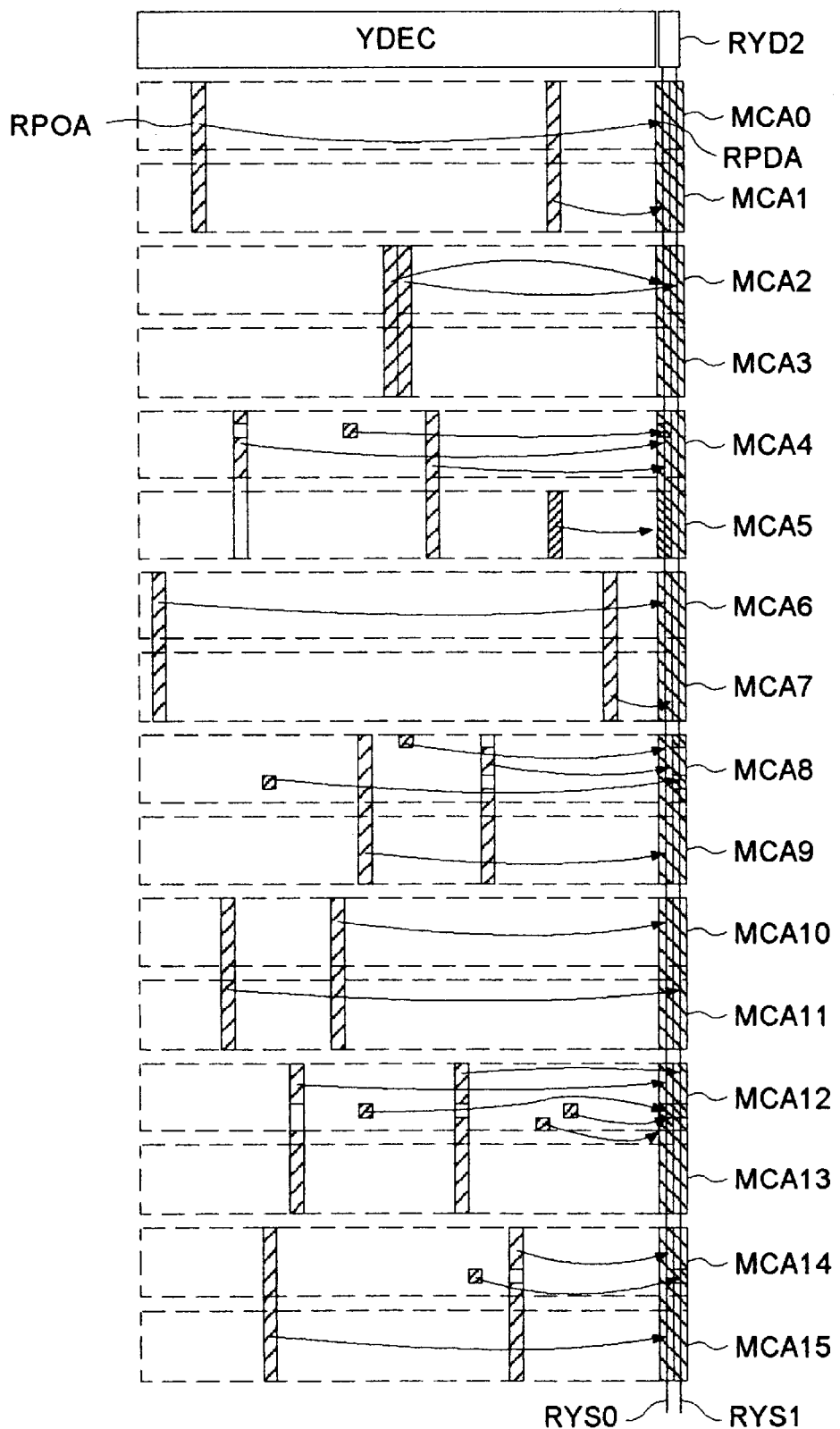
FIG. 27 is a diagram of an example of the replacement of a column selection line according to the embodiment of the invention.

FIG. 27 shows an example of the replacement of column selection line in this embodiment. Like the replacement shown in FIG. 16, the right-up hatched regions RPOA are replaced by the right-down hatched regions RPOD. The redundant column selection lines RYS0, RYS1 each replace column selection lines at 12 places, and there are mixed block redundancy for unit of two successive mats, and bit repair for smaller unit. In other words, the two adjacent mats have a mixture of block redundancy for replacement of unit of the data line selected by the column address signal, and bit repair for replacement of unit of the intersection regions between the data line selected by the column address and a predetermined number of word lines in one mat. Moreover, block redundancy for replacement of one-mat unit can be performed. For example, in the mat MCA4, the redundant column selection line RYS0 is used in bit repair and except-inside block redundancy of one-mat unit. This mixed repair can be performed by taking priority of the block redundancy using row address comparator BXC1 in mat MCA5 and bit repair in mat MCA4 over the block redundancy of mats MCA4, MCA5 using mat selection signal OR circuit MSP.

In this embodiment, although there is provided no fuse decision circuits for controlling the YS repair that replaces a certain column selection line without using the row address, the block redundancy for the same column address can be performed by only one redundant column selection line.

Since the mat selection signal OR circuit MSP shown in FIG. 26 has one fuse decision circuit, the row address decision for eight block redundancy regions can be made by eight fuse decision circuits. When eight address comparators BXUC1 shown in FIG. 7 are used, the total number of fuse decision circuits is 40. In this embodiment, the row address comparing function equivalent to that is realized by less than half the number of fuse decision circuits like the column-side repair circuit shown in FIG. 22. As compared with the column-side repair circuit shown in FIG. 22 that uses the address shifter shown in FIG. 23, the mat selection signal OR circuit MSP shown in FIG. 26 has a simple construction, and thus uses a smaller number of transistors.

When the fuse set is provided for each mat, the number of fuse sets increases, and thus the number of fuses for storing the repair column address increases. In this embodiment, the number of fuses can be reduced to a reasonable value by taking a logic sum of mat section signals. In addition, the total number of fuse sets can be optimized by adjusting the number of fuse sets for bit repair.

<Embodiment 7>

Figure 28:
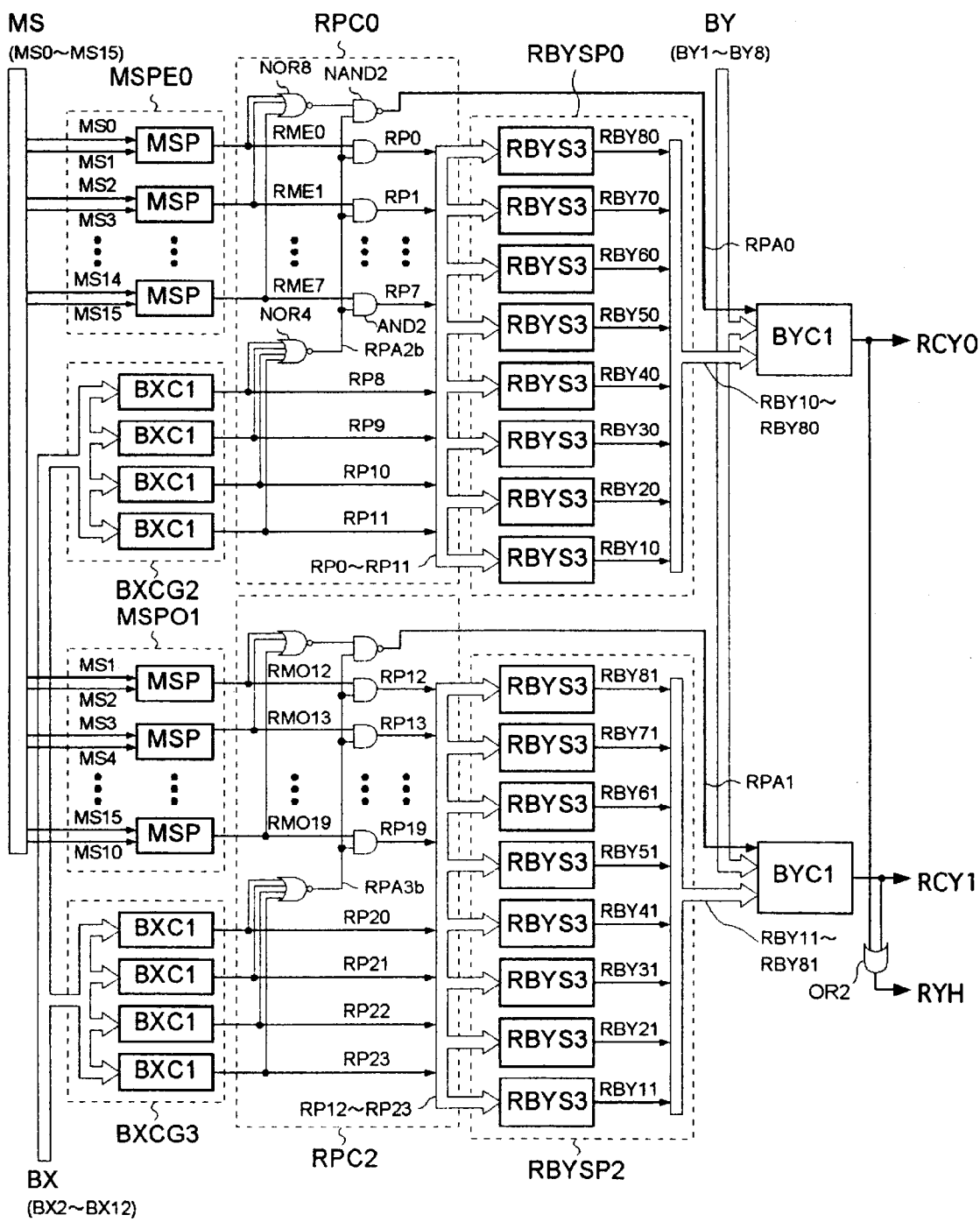
FIG. 28 is a diagram of a modification of the column-side repair decision circuit shown in FIG. 25.

FIG. 28 shows a modification of the column-side repair circuit shown in FIG. 25. The feature of this construction is that the replacement for defects of sense amplifiers is made possible by making effective use of the replacement of column selection line for every two mats in block redundancy. Here, too, an OR circuit group MSPO1 is provided instead of OR circuit group MSPE1 in the column-side repair circuit that is, as shown in FIG. 22, constructed to produce two compared decision results RCY0, RCY1 each of which can control a maximum of 12 replacements with block redundancy and bit repair mixed. This OR circuit group MSPO1 is formed of eight mat selection signal OR circuits MSP like the OR circuit group MSPE1 shown in FIG. 25, but it is different in the combination of input mat selection signals. The other elements are the same as shown in FIG. 25. That is, it has two row address comparator groups BXCG2, BXCG3, two control circuits RPC0, RPC1 for row address compared results, two repair column address selector groups RBYSP0, RBYSP1, two column address comparators BYC1, and dual-input OR gate OR2. These elements operate in the same way as in the column-side repair circuit shown in FIG. 25.

Figure 29:
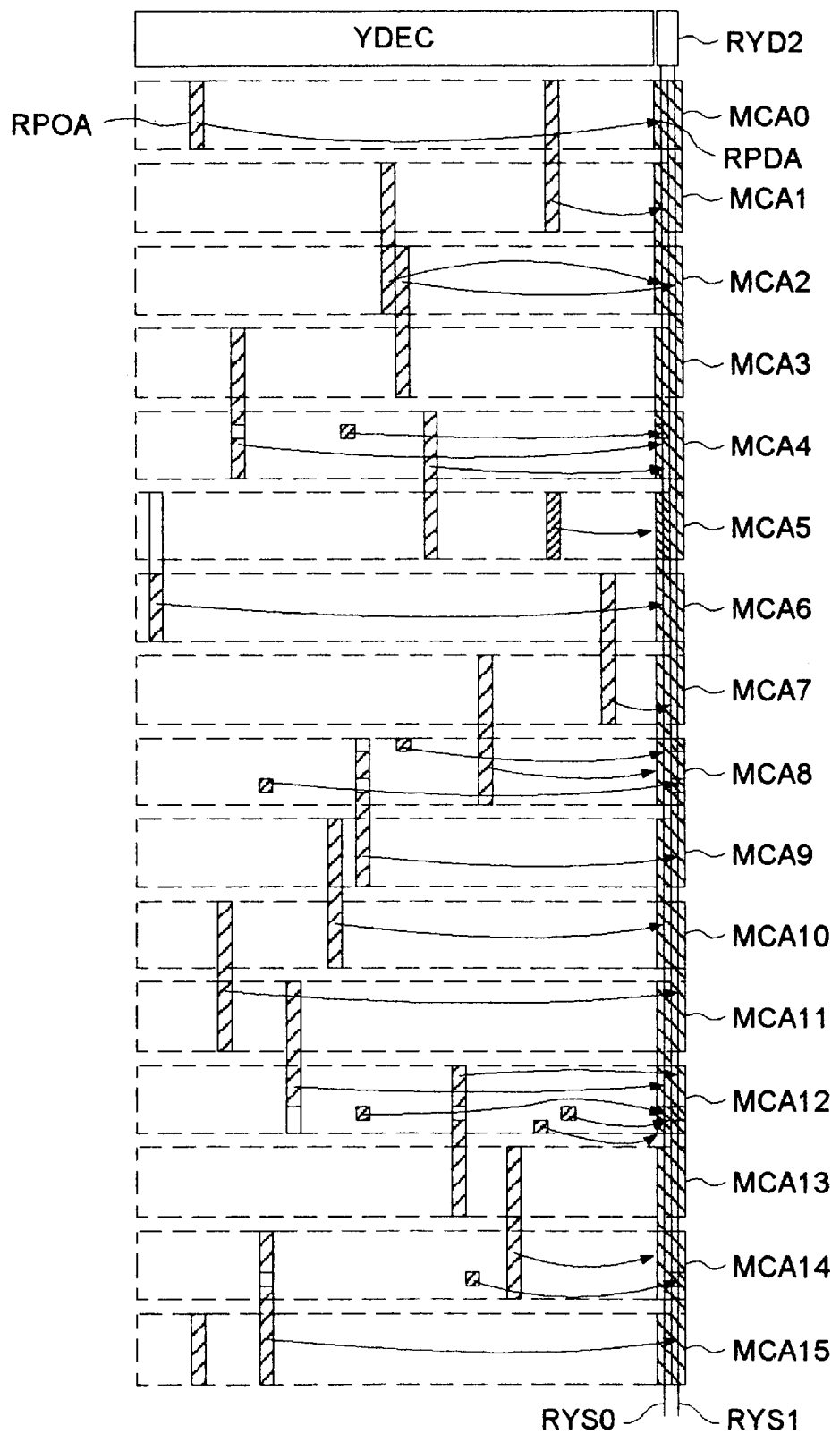
FIG. 29 is a diagram of an example of the replacement of a column selection line by the column-side repair circuit shown in FIG. 28.

FIG. 29 shows an example of the replacement of column selection line by the column-side repair circuit shown in FIG. 28. Like the replacement shown in FIG. 16, the right-up hatched regions RPOA are replaced by the right-down hatched regions RPDA. The redundant column selection lines RYS0, RYS1 each replace column selection lines at 12 places, and there are mixed block redundancy of unit of two successive mats, and bit repair of smaller unit. In other words, block redundancy for replacing data line unit selected by column address signal in two adjacent mats is mixed with bit repair for replacing unit of intersection regions between a data line selected by column address and a predetermined number of word lines in one mat. In addition, like the replacement shown in FIG. 27, block redundancy of one-mat unit is performed. Here, the two-mat unit of block redundancy that the redundant column selection line RYS0 makes is shifted one mat from the two-mat unit of block redundancy that the redundant column selection line RYS1 makes. For example, the redundant column selection line RYS0 replaces mats MCA0 and MCA1, while the redundant column selection line RYS1 replaces mats MCA1 and MCA2. As shown in FIG. 13, since a sense amplifier portion is provided between mats, making such block redundancy enables the defect of the sense amplifier within the sense amplifier portion SAB1 provided between the mats MCA0 and MCA1 to be repaired by the redundant column selection line RYS0, or one block redundancy and the defect of the sense amplifier within the sense amplifier portion SAB2 provided between the mats MCA1 and MCA2 to be repaired by the redundant column selection line RYS1, or one block redundancy. This block redundancy can be attained by one fuse set, and thus the fuse set can be effectively used.

<Embodiment 8>

Figure 30:
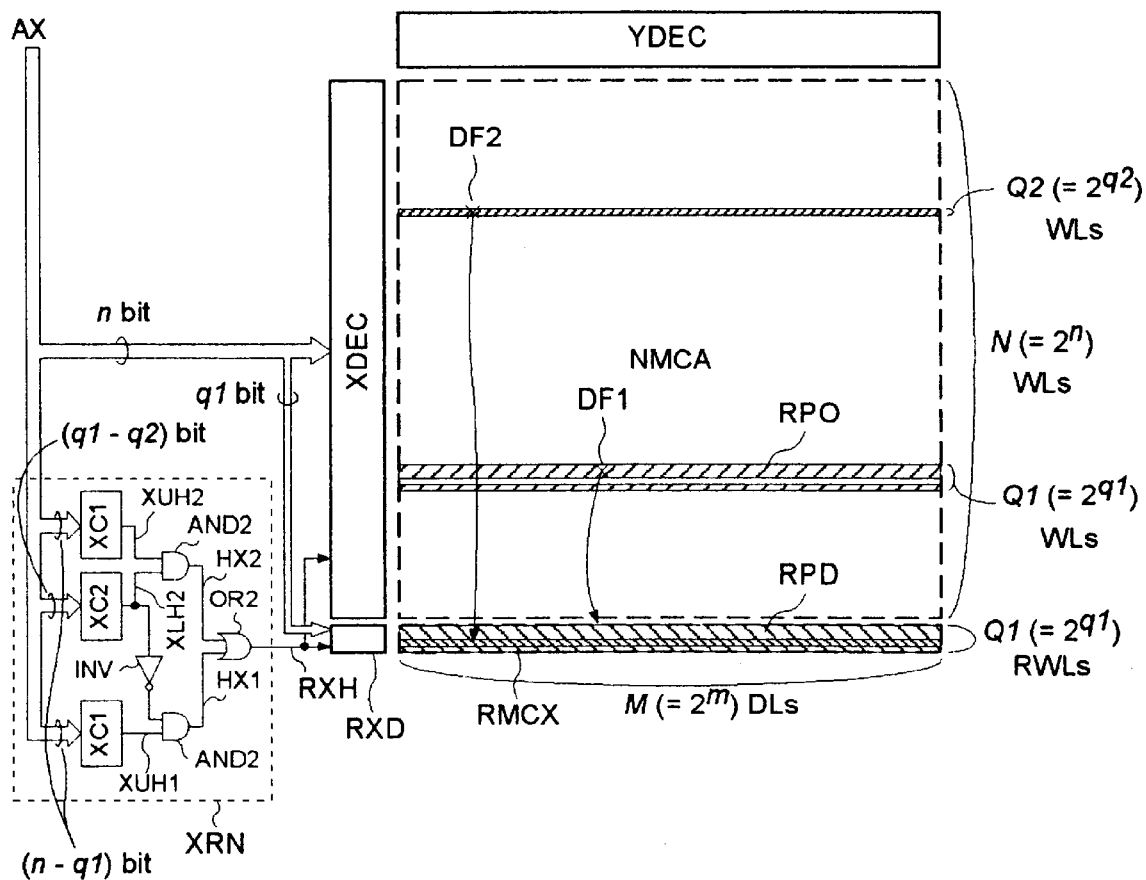
FIG. 30 is a schematic diagram of another embodiment of a column redundant system according to the invention.

Various examples of the redundant system in which the present invention is applied to the column-side repair have been described so far. The present invention can be applied not only to the column-side repair, but also to the row-side repair. FIG. 30 shows an embodiment of the redundant system in which the present invention is applied to the row-side repair. As illustrated, a word line is replaced by a redundant word line so that the memory cell group of two regions including defects can be replaced by the redundant memory cell group. Like the column-side repair shown in FIG. 1, the feature of this embodiment is that replacement decision is performed so that the region to be replaced by the second replacement is smaller than that replaced by the first replacement and that the second replacement can be given priority.

The memory array NMCA and redundant cell array RMCX are provided and controlled by the repair decision circuit XRN.

The memory array NMCA has memory cells provided at the intersections of N word lines WLs and M data lines DLs, and those memory cells are selected by the row decoder XDEC and column decoder YDEC. The redundant cell array RMCX has redundant memory cells provided at the intersections between Q1 redundant word lines RWLs, and P data lines DLS, and the redundant memory cells are selected by a redundant row decoder RXD and the column decoder YDEC. The row decoder XDEC decodes the row address AX of n bits, and selectively drives one of the $2^n$, or N word lines. The column decoder YDEC decodes the column address AV of m bits, and selects one of the $2^m$, or M data lines. The redundant row decoder RXD decodes the q1 bits of the row address AX, and selects one of the $2^{q1}$, or Q1 redundant data lines. The row decoder YDEC and redundant row decoder RXD are controlled by the repair decision result RXH from the repair decision circuit XRN so that the memory cell groups of defects DF1, DF2 can be replaced by redundant memory cell groups.

The repair decision circuit XRC has two high-order row address comparators XC1, a low-order row address comparator XC2, an inverter INV, two dual-input AND gates AND2, and a dual-input OR gate OR2. Only the high-order row address comparator XC1 stores the repair address for the first replacement, and the high-order row address comparator XC1 and the low-order row address comparator XC2 store the repair address for the second replacement. The high-order row address comparator XC1 includes address storage means for storing the repair address of (n−q1) bits, and compares with the (n−q1) bits of the row address AX. The low-order row address comparator XC2 includes address storage means for storing the repair address of (q1−q2) bits, and compares with the (n−q2) bits of the row address AX. The inverter INV inverts the coincidence decision result XLH2 of the low-order row address comparator XC2, and the dual-input AND gate AND2 takes a logic product of this inverted coincidence decision result and the coincidence decision result XUH1 of the row address comparator XC1 to produce the first decision result HX1 for the first replacement. The dual-input AND gate AND2 takes a logical product of the coincidence decision result XLH2 of the low-order row address comparator XC2 and the coincidence decision result XUH2 of the high-order row address comparator XC1 to produce the second decision result HX2 for the second replacement. The dual-input OR gate OR2 takes a logic sum of the decision results HX1, HX2 to produce the repair decision result RXH. Since this repair decision circuit XRN is constructed as above, when the low-order row address comparator XC2 produces coincidence as the coincidence decision result, the first decision result HX1 is '0', and the second decision result HX2 is produced according to the coincidence decision result XUH2 of the high-order row address comparator XC1. In other words, the second replacement is given priority over the first replacement.

The replacement unit in the first replacement is the region selected by $2^{q1}$, or Q1 word lines, and that in the second replacement is the region selected by $2^{q2}$, or Q2 word lines. In this case, when the Q1 word lines for the first replacement include the Q2 word lines for the second replacement, the region for the first replacement is the except-inside region selected by the (Q1−Q2) word lines, or by the remainder of subtraction of the Q2 word lines for the second replacement from the Q1 word lines for the first replacement. In that case, the memory cells selected by the Q2 word lines for the second replacement in the region selected by the Q1 word lines for the first replacement are accessed to without being replaced by redundant memory cells.

In this repair system, if the region to be selected by the Q2 word lines for the second replacement is different from the region for the first replacement, two defects can be repaired. By decreasing the word line number Q2, it is possible to reduce the probability that competition for redundant memory cells occurs to prevent the repair even if the word line number Q1 is large. In that case, although the bit number (q1−q2) of the row address that the low-order row address comparator XC2 compares with increases to make the circuit scale of the low-order row address comparator XC2 large, the bit number (n−q1) of the row address that the high-order row address comparator XC1 compares with becomes large, so that the circuit scale of the high-order row address comparator XC1 does not increase. Therefore, the application of the invention to the row-side repair makes it possible to control the replacement so as to avoid the competition for the redundant cells in the address comparator of a small circuit scale that compares with a small number of bits, and thus to effectively repair defects.

<Embodiment 9>

Figures 31A, 31B, 31C:
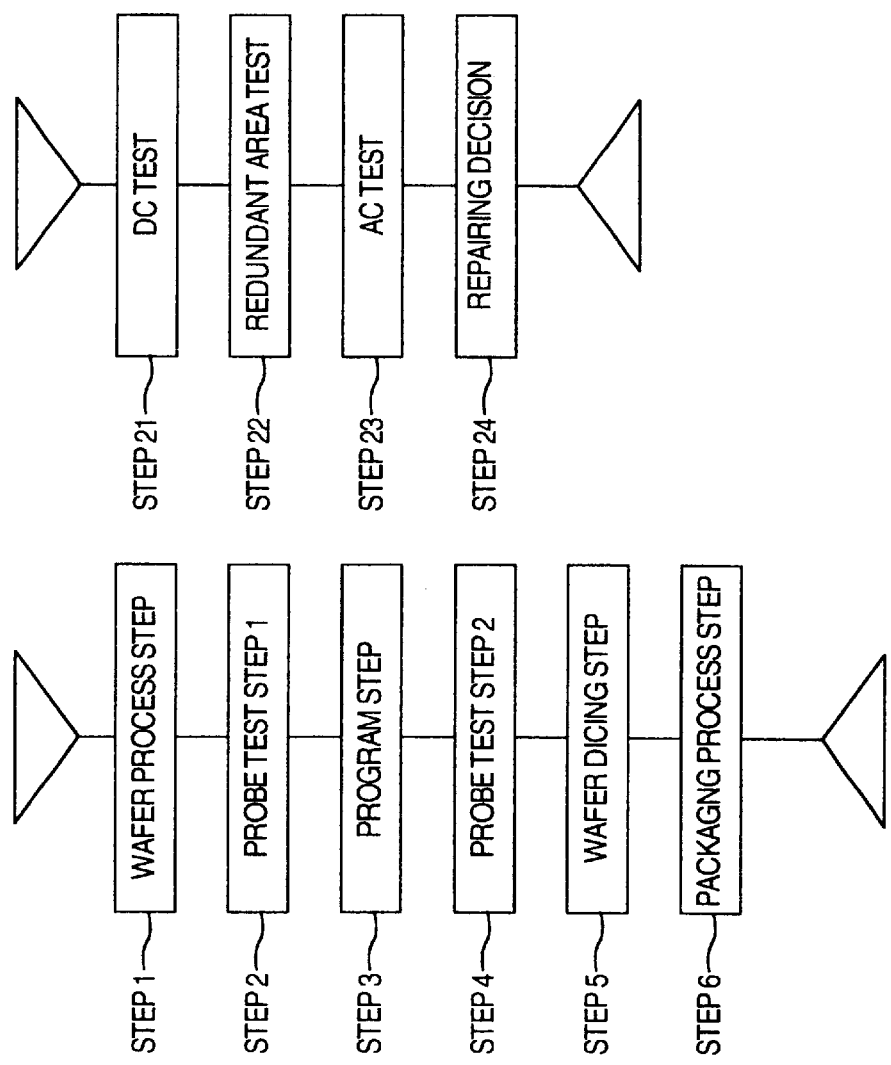
FIGS. 31a, 31b and 31c are a process flow diagram showing a manufacturing method of DRAM of another embodiment according to the invention.

FIGS. 31a, 31b and 31c show an example of the manufacturing flow in a method of manufacturing a DRAM of this embodiment. FIG. 31a is a manufacturing flow diagram in, a method of manufacturing a DRAM. FIG. 31b shows a probe test process 1 in the manufacturing flow, and FIG. 31c shows a process of the repair decision in the probe test process 1.

Referring to FIG. 31a, a semiconductor wafer undergoes repetitions of thin film deposition, oxidation, doping, anneal, resist processing, exposure, etching, cleaning, and CMP so that a wafer process step can be performed to form memory arrays on chips, and DRAMs including certain ICs such as repair circuits shown in FIG. 1 or 3 (STEP 1). The semiconductor wafer thus processed is examined for its electric characteristics by a probe test step in which tests such as DC test, AC test and redundant area test are performed by making the probe of a wafer prober contact with the pads of each chip (STEP 2). After the end of the probe test step 1, a program step is performed in which the fuses included in the repair circuit are blown out by laser or the like on the basis of the test results (STEP 3). Then, a probe test process 2 is made in which electric characteristics are tested including the confirmation of whether the defects have been repaired (STEP 4). After the probe test process 2, a wafer dicing step is performed for cutting off the semiconductor wafer into chips by a dicing saw (STEP 5). Thereafter, a packaging process step is made by incorporating the cut off chips, for example, mounting each chip on the die pad of a lead frame, connecting the pads of the chip to the inner leads of the lead frame through wire, and sealing the chip with a resin or the like (STEP 6). Thus, a packaged DRAM can be produced.

One example of the process flow of the probe test step 1 will be described in detail with reference to FIG. 31b. This probe test step 1 makes first DC test such as measurement of open, short, power source current, and leakage current (STEP 21), redundant test for checking the defective bits within the redundant memory cell array (STEP 22), and then AC test for function check (STEP 23), thus examining if a defect or defects are present in the memory cells within the memory cell array or in the word lines and data lines for selecting the memory cells. In addition, if a defect or defects to be repaired exist, repair decision is performed for determining how the repair is made (STEP 24).

An embodiment of the repair algorithm for relieving defects in the repair decision will be described with reference to FIG. 31c. First, a fail bit map is produced according to each test (STEP 241). The fail bit map shows the detected defects as a two-dimensional distribution. Then, the defects are classified into (1) defective YS line, (2) defective data line, (3) defective bit, on the basis of the fail bit map (STEP 242). Here, the defective YS line (1) is the defect chiefly due to the column selection line shown in FIG. 13, for example, disconnection of column selection line. The defective data line (2) is the defect chiefly due to data line or due to sense amplifier, for example, disconnection of data line. The defective bit (3) is the defect chiefly due to memory cell, for example, defective refresh characteristic. After the classification, first the defective YS line is repaired (STEP 243), and then the defective data line is repaired (STEP 244). In addition, the defective-bit is repaired by assigning to block redundancy (STEP 245), and the defective bit that cannot be allotted to block redundancy is repaired by bit repair (STEP 246).

Figure 32:
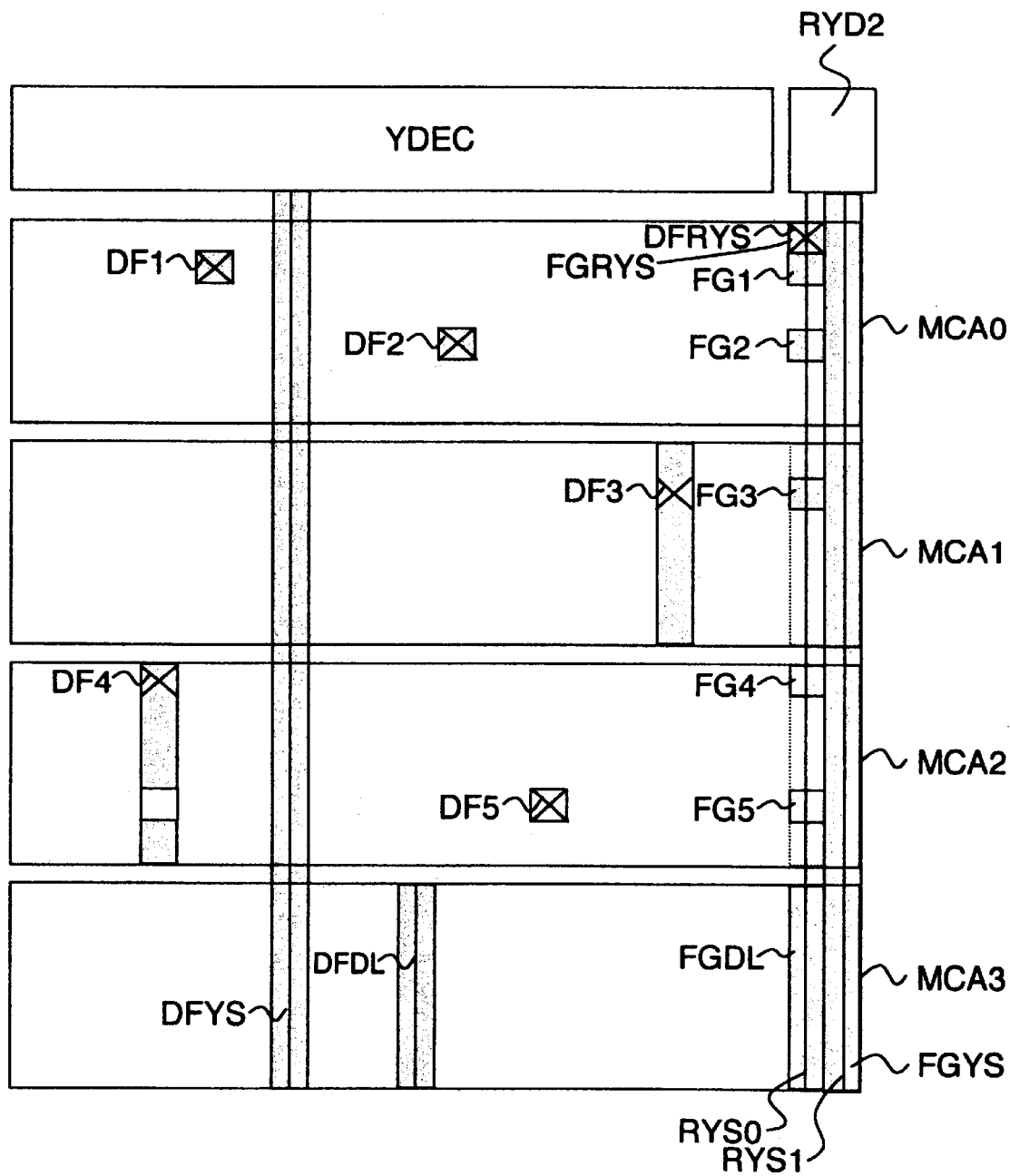
FIG. 32 is a diagram of an example of the defect repair according to the embodiment of the invention.

Thus, a method of assigning each defect to redundant YS line (STEP 243–246) will be described in detail with reference to FIG. 32. In FIG. 32, DF 1–5 indicate the defective bits, DFDL the defective data lines, and DFYS the defective YS line. If a defect DFRYS is found in redundant YS line RYS0, RYS1 by a previously performed redundant area test, since that portion cannot be used for repair, a flag FGRYS is raised that means that it cannot be replaced. Then, the YS line defect DFYS is relived. In this case, it is necessary to repair the defective lines by use of all redundant regions. Therefore, the defective lines cannot be replaced by the redundant YS line RYS0 on which the flag FGRYS is raised. Thus, the defective YS line DFYS is assigned to the redundant YS line RYS1, and a flag FGYS is raised at the region in which the defective YS line DFYS is replaced (in this case, all the redundant YS line RYS1). Then, the repair of defective data line DFDL is considered. Since the flag FGYS is already raised on the redundant YS line RYS1, it is assigned to block redundancy so as to be replaced by the redundant YS line RYS0 with no flag raised. In that case, a flag FGDL is raised on the region of redundant YS line RYS0 for the defective data line DFDL.

Then, the defective bits DF1~DF5 are repaired. As an example of the way of repair assignment, repair is here made in the order from memory cell array MCA0 to MCA3, though not particularly restricted thereto. First in the memory cell array MCA0, when defective bits DF1, DF2 are repaired, since the flag FGYS or FGRYS is raised on both redundant YS lines RYS0, RYS1, they cannot be allotted to block redundancy. Thus, the defective bits DF1, DF2 are assigned to bit repair. Then, the flags FG1, FG2 are raised on the redundant YS line RYS0. In the memory cell array MCA1, since no flag is raised on the redundant YS line RYS0, the defective bit DF 3 is assigned to block redundancy. In that case, the flag FG3 is raised only at the region corresponding to the defective bit DF3. Thus, since flags are raised not on all the replacing regions, but only on the region corresponding to the defective bit DF3, the portions other than the flag FG3 can be repaired. Even if the above defective bit is repaired by block redundancy, the regions necessary for the replacing redundant YS line are only the portions for replacing defective bits. Therefore, other defects may be replaced by other regions than flag FG3.

Then, in the memory cell array MCA2, a defective bit DF4 is assigned to block redundancy as is the defective bit DF3, and a flag FG4 is raised on the redundant YS line RYS0. In addition, a defective bit DF5 cannot be allotted to bock redundancy since the flag FGYS or FG4 is raised on both the redundant YS lines RYS0, RYS1. Thus, the defective bit DF5 is assigned to bit repair, and a flag FG5 is raised on the redundant YS line RYS0. If a flag indicating "occupied" is raised on all the replacing regions of the redundant YS line when the defective bit DF4 is repaired, the defective bit DF5 cannot be repaired later. Thus, even if a defective bit is allotted to block redundancy, except-inside block redundancy can be made by raising a flag only on the region of redundant YS line necessary for the defective bit. By using the above repair algorithm, it is possible to preferentially assign defects to the small-number fuse set for block redundancy, reduce the number of blown-out fuses, and shorten the manufacturing process.

While an example of the manufacturing flow has been mentioned above, the flow can be variously changed without departing from the scope of the invention. If, for example, anti-fuse or other electric fuse is used for the program element, programming can be made by a tester that is used in the probe test process. Even in that case, since the number of programs in the program elements is decreased, it does not take a long time. In addition, not only the repair algorithm but also other algorithms may of course be used for repair. Even in that case, by assigning defective bits to block redundancy, it is possible to reduce the number of blown-out fuses, and thus shorten the manufacturing process. Moreover, since the above three-kind classification of defects is the minimum, other kinds of classification can be added. For example, row-side defects such as disconnection of word line may be added. Furthermore, flags may be specified on memory cells included in the redundant YS lines, and on regions of redundant YS lines.

According to the above embodiments, as compared with the prior art, the replacement in the address comparator with a small number of bits and of a small circuit scale can be controlled to avoid the competition for replacing regions and can be made to effectively relieve defects. The result is that a semiconductor memory device having a defect repair circuit with a small area and high repair efficiency can be produced at low cost.

What is claimed is:

1. A semiconductor memory device comprising:
   a first cell array comprising a plurality of memory cells provided at the intersection of a plurality of word lines and a plurality of bit lines;
   a second cell array for, when said first cell array includes first and second defects, replacing said first and second defects; and
   a repair decision circuit comprising a first row address comparator for storing (n−q1) bits of address and outputs a first decision result, a second row address comparator for storing (n−q2) bits of address and outputs a second decision result, and a selection circuit coupled to said first and second row address comparators,
   wherein said repair decision circuit outputs replacing information for replacing said first and second defects in (n−q1) bit region by comparing (n−q1) bits of row address with address stored in said first row address comparator and comparing (n−q2) bits of row address with address stored in said second row address comparator,
   wherein said second defect is given priority to be replaced over said first defect; and
   wherein q1 is larger than q2.

2. A semiconductor memory device according to claim 1,
   wherein said repair decision circuit further comprises a first column address comparator for storing (m−p) bits of address and a second column address comparator for storing (m−p) bits of address, and
   wherein said repair decision circuit outputs replacing information for replacing said first and second defects by comparing (m−p) bits of column address with address stored in said first and second column address comparators.

3. A semiconductor memory device according to claim 2,
   wherein said selection circuit comprises an inverter coupled to said second row address comparator, a first AND gate coupled to said first row comparator, said first column address comparator, and said inverter, a second AND gate coupled to said second row address comparator and said second column address comparator, and OR gate coupled to said first and second AND gates.

4. A semiconductor memory device according to claim 1,
   wherein said selection circuit comprises a column address selector having a first and second storage means for storing (m−p) bits of address,
   wherein said repair decision circuit further comprises a column address comparator, and is coupled to said selection circuit, and
   wherein said repair decision circuit outputs replacing information for replacing said first and second defects by comparing (m−p) bits of column address with address stored in said column address selector.

5. A semiconductor memory device according to claim 4,
   wherein said selection circuit comprises an inverter coupled to said second row address comparator, and a AND gate coupled to said first row address comparator and said inverter.

6. A semiconductor memory device comprising:
   a plurality of first memory cells coupled to first word lines and first bit lines;
   a plurality of second and third memory cells for replacing said first memory cells;
   a first row address comparator comprising a first input node for inputting (n−q1) bits of address, a first address storage means for storing (n−q1) bits of repair address, and a first output node for outputting a first decision result when address inputted in said first input node matches address in said first address storage means;
   a second row address comparator comprising a second input node for inputting (n−q2) bits of address, a second address storage means for storing (n−q2) bits of repair address, and a second output node for outputting a second decision result when address inputted in said second input node matches address in said second address storage means; and
   a selection circuit coupled to said first and second output nodes,
   wherein said selection circuit outputs first selection result for selecting said second memory cells when said first decision result is inputted, and outputs second selection result for selecting said third memory cells when said second decision result is inputted, and outputs said second selection result when said first and second decision results are inputted, and
   wherein q1 is larger than q2.

7. A semiconductor device according to claim 6, further comprising:
   a first column address comparator comprising a third input node for inputting (m−p) bits of address, a third storage means for storing (m−p) bits of repair address, and a third output node for outputting a third decision result when address inputted in said third input node matches address in said third address storage means; and
   a second column address comparator comprising a fourth input node for inputting (m−p) bits of address, a fourth address storage means for storing (m−p) bits of repair address, and a fourth output node for outputting a fourth decision result when address inputted in said fourth input node matches address in said fourth address storage means.

8. A semiconductor device according to claim 6,
   wherein said selection circuit further comprises a column address selector comprising two address storage means for storing (m−p) bits of repair address and a third output node for outputting (m−p) bits if address, a column address comparator comprising a third input node for inputting (m–p) bits of address, and wherein said column address selector is coupled to said first and second row address comparators, and said column address comparator is coupled to said column address selector.

* * * * *